United States Patent
Nakamura et al.

(10) Patent No.: US 12,453,122 B2
(45) Date of Patent: Oct. 21, 2025

(54) SEMICONDUCTOR DEVICE HAVING SEMICONDUCTOR REGION AT BOTTOM OF SEPARATION TRENCH AND CONNECTING TWO SEMICONDUCTOR REGIONS OVER WHICH CONTROL ELECTRODE EXTENDS

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Mitsutoshi Nakamura, Kawasaki Kanagawa (JP); Masami Nagaoka, Ebina Kanagawa (JP); Kazuya Nishihori, Shibuya Tokyo (JP); Keita Masuda, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 534 days.

(21) Appl. No.: 17/901,746

(22) Filed: Sep. 1, 2022

(65) Prior Publication Data
US 2023/0290876 A1 Sep. 14, 2023

(30) Foreign Application Priority Data
Mar. 14, 2022 (JP) ................. 2022-039666

(51) Int. Cl.
*H01L 23/66* (2006.01)
*H10D 12/00* (2025.01)
(Continued)

(52) U.S. Cl.
CPC ........... *H10D 30/668* (2025.01); *H01L 23/66* (2013.01); *H10D 12/441* (2025.01);
(Continued)

(58) Field of Classification Search
CPC ............... H10D 30/668; H10D 12/441; H10D 30/0297; H10D 62/104; H10D 30/0212;
(Continued)

(56) References Cited

U.S. PATENT DOCUMENTS 5,780,327 A 7/1998 Chu et al.
7,902,584 B2 3/2011 Nakajima
(Continued)

FOREIGN PATENT DOCUMENTS

JP H08116066 A 5/1996
JP 3301057 B2 7/2002
(Continued)

OTHER PUBLICATIONS

Notice of Reasons for Refusal (Office Action) mailed Mar. 19, 2025 in corresponding Japanese Patent Application No. 2022-039666 with English machine translation, 10 pages.

*Primary Examiner* — William B Partridge
*Assistant Examiner* — Erik A. Anderson
(74) *Attorney, Agent, or Firm* — Kim & Stewart LLP

(57) ABSTRACT

A semiconductor device includes an insulating layer, a semiconductor layer on the insulating layer, and a control electrode on the semiconductor layer. The semiconductor layer includes first and second semiconductor parts and a separation trench between the first and second semiconductor parts. The first and second semiconductor parts extending along the insulating film. The first semiconductor part includes first and second regions of a first conductivity type, and a fifth region of a second conductivity type between the first and second regions. The second semiconductor part includes third and fourth regions of the second conductivity type, and a sixth region of the second conductivity type between the third and fourth regions. The control electrode extends over the fifth and sixth regions. The semiconductor (Continued)

layer further including a seventh region of the second conductivity type at a bottom of the separation trench and electrically connecting the fifth and sixth regions.

14 Claims, 18 Drawing Sheets

(51) Int. Cl.
*H10D 30/01* (2025.01)
*H10D 30/66* (2025.01)
*H10D 62/10* (2025.01)

(52) U.S. Cl.
CPC ....... *H10D 30/0297* (2025.01); *H10D 62/104* (2025.01); *H01L 2223/6677* (2013.01)

(58) Field of Classification Search
CPC .... H10D 30/62; H10D 86/215; H10D 62/124; H10D 30/60; H10D 64/513; H01L 23/66; H01L 2223/6677; H01L 23/4824
See application file for complete search history.

(56) References Cited

U.S. PATENT DOCUMENTS

| | | | |
|---|---|---|---|
| 2002/0003256 A1* | 1/2002 | Maegawa | H10D 30/673 |
| | | | 257/E29.13 |
| 2004/0026746 A1* | 2/2004 | Nakazawa | H01L 21/76264 |
| | | | 257/374 |
| 2004/0164791 A1 | 8/2004 | Batruni | |
| 2007/0023756 A1 | 2/2007 | Anderson et al. | |
| 2014/0054706 A1 | 2/2014 | Liu et al. | |
| 2014/0159166 A1 | 6/2014 | Basker et al. | |
| 2014/0167172 A1 | 6/2014 | Chen et al. | |
| 2015/0145025 A1* | 5/2015 | Yoshida | H01L 23/49524 |
| | | | 257/329 |

FOREIGN PATENT DOCUMENTS

| | | |
|---|---|---|
| JP | 2006-514479 A | 4/2006 |
| JP | 2008-288567 A | 11/2008 |
| JP | 2009-512996 A | 3/2009 |
| JP | 2014-042021 A | 3/2014 |
| JP | 2015-053453 A | 3/2015 |
| JP | 2015-536581 A | 12/2015 |
| JP | 6083707 B2 | 2/2017 |

* cited by examiner

SEMICONDUCTOR DEVICE HAVING SEMICONDUCTOR REGION AT BOTTOM OF SEPARATION TRENCH AND CONNECTING TWO SEMICONDUCTOR REGIONS OVER WHICH CONTROL ELECTRODE EXTENDS

CROSS-REFERENCE TO RELATED APPLICATIONS

This application is based upon and claims the benefit of priority from Japanese Patent Application No. 2022-039666, filed on Mar. 14, 2022; the entire contents of which are incorporated herein by reference.

FIELD

Embodiments relate to a semiconductor device.

BACKGROUND

A bidirectional transistor used to control a high-frequency antenna is required to have low loss and a high breakdown voltage.

DETAILED DESCRIPTION

Figure 1:
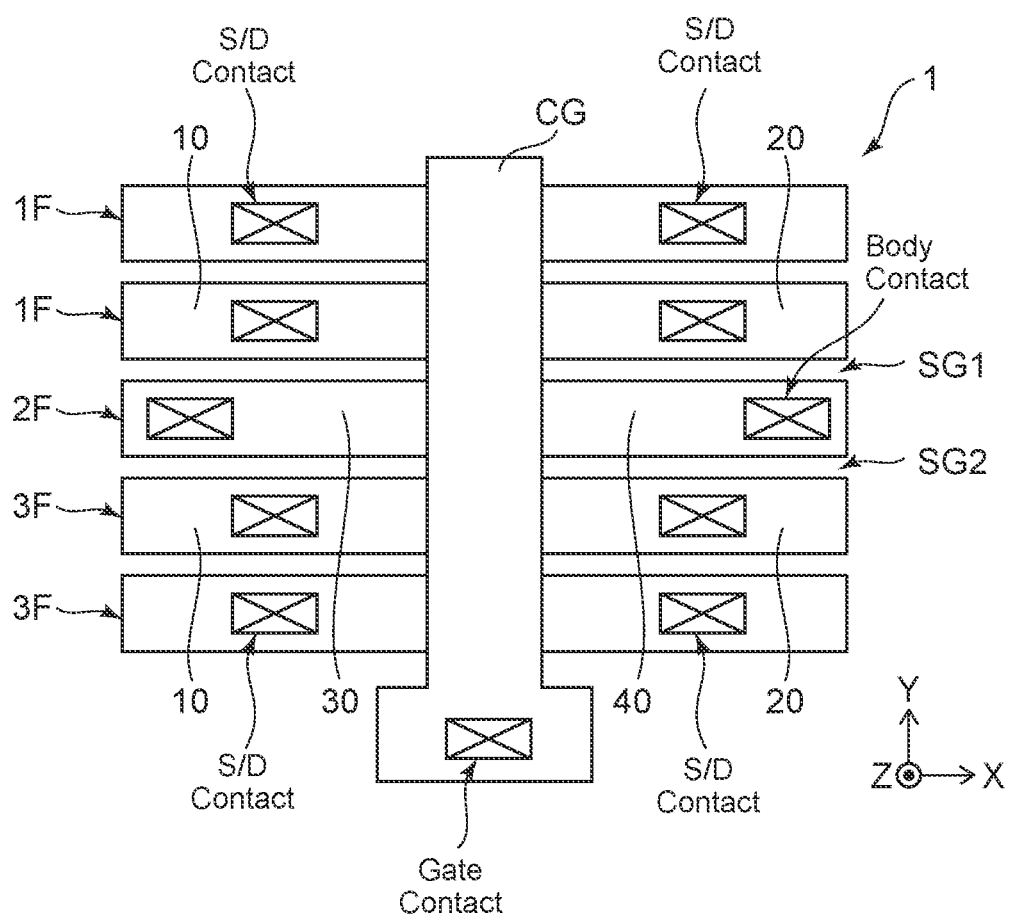
FIG. 1 is a schematic plan view showing a semiconductor device according to an embodiment.

According to one embodiment, a semiconductor device includes an insulating layer, a semiconductor layer and a control electrode. The semiconductor layer is provided on the insulating layer. The semiconductor layer includes first and second semiconductor parts each extending in a first direction along a front surface of the insulating film. The first and second semiconductor parts are arranged in a second direction along the front surface of the insulating film, the second direction crossing the first direction. The control electrode is provided on the semiconductor layer, and extends in the second direction over the first and second semiconductor parts. The control electrode is electrically insulated from the semiconductor layer by a first insulating film. The semiconductor layer includes a first separation trench provided between the first semiconductor part and the second semiconductor part. The first separation trench extends in the first direction, and is partially filled with a portion of the control electrode. The first semiconductor part includes first and second semiconductor regions of a first conductivity type. The first and second semiconductor regions are arranged in the first direction. The second semiconductor part includes third and fourth semiconductor regions of a second conductivity type. The third and fourth semiconductor regions are arranged in the first direction. The first semiconductor part further includes a fifth semiconductor region of the second conductivity type. The fifth semiconductor region is provided between the first semiconductor region and the second semiconductor region. The second semiconductor part further including a sixth semiconductor region of the second conductivity type. The sixth semiconductor region is provided between the third semiconductor region and the fourth semiconductor region. The control electrode extends over the fifth semiconductor region of the first semiconductor part and the sixth semiconductor region of the second semiconductor part. The semiconductor layer further including a seventh semiconductor region of the second conductivity type. The seventh semiconductor region is provided at a bottom of the first separation trench and electrically connecting the fifth semiconductor region and the sixth semiconductor region.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic plan view showing a semiconductor device 1 according to an embodiment. The semiconductor device 1 is a bidirectional transistor. The semiconductor device 1 includes a first semiconductor part 1F, a second semiconductor part 2F, a third semiconductor part 3F, and a control electrode CG.

As shown in FIG. 1, the semiconductor parts 1F to 3F extend in a first direction, e.g., an X-direction and are arranged in a second direction, e.g., a Y-direction that crosses the first direction. The second semiconductor part 2F is provided between the first semiconductor part 1F and the third semiconductor part 3F.

The control electrode CG extends in the Y-direction and is provided over the first semiconductor part 1F, the second semiconductor part 2F, and the third semiconductor part 3F. The control electrode CG is, for example, a gate electrode. A gate contact is provided on the control electrode CG.

The first semiconductor part 1F and the third semiconductor part 3F each include a first semiconductor region of a first conductivity type and a second semiconductor region of the first conductivity type. The first semiconductor region and the second semiconductor region 20 are arranged in the X-direction; and the control electrode CG is provided between the first semiconductor region 10 and the second semiconductor region 20 in a plan view parallel to the X-Y plane. Source/drain contacts (S/D Contact) are provided on the first and second semiconductor regions 10 and 20.

The second semiconductor part 2F includes a third semiconductor region 30 of a second conductivity type and a fourth semiconductor region 40 of the second conductivity type. In the following description, the first conductivity type is an n-type, and the second conductivity type is a p-type. The third semiconductor region 30 and the fourth semiconductor region 40 are arranged in the X-direction; and the control electrode CG is provided between the third semiconductor region 30 and the fourth semiconductor region 40 in a plan view parallel to the X-Y plane. Body contacts are provided on the third and fourth semiconductor regions 30 and 40, respectively.

Figure 2A:
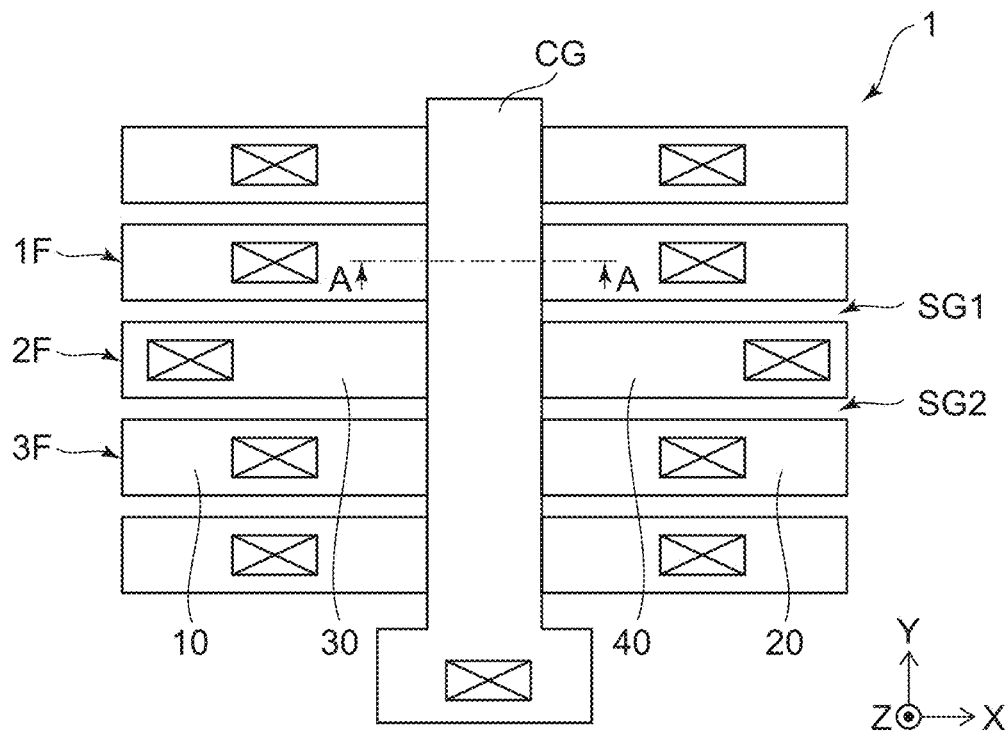
FIGS. 2A and 2B are schematic views showing the semiconductor device according to the embodiment.
Figure 2B:
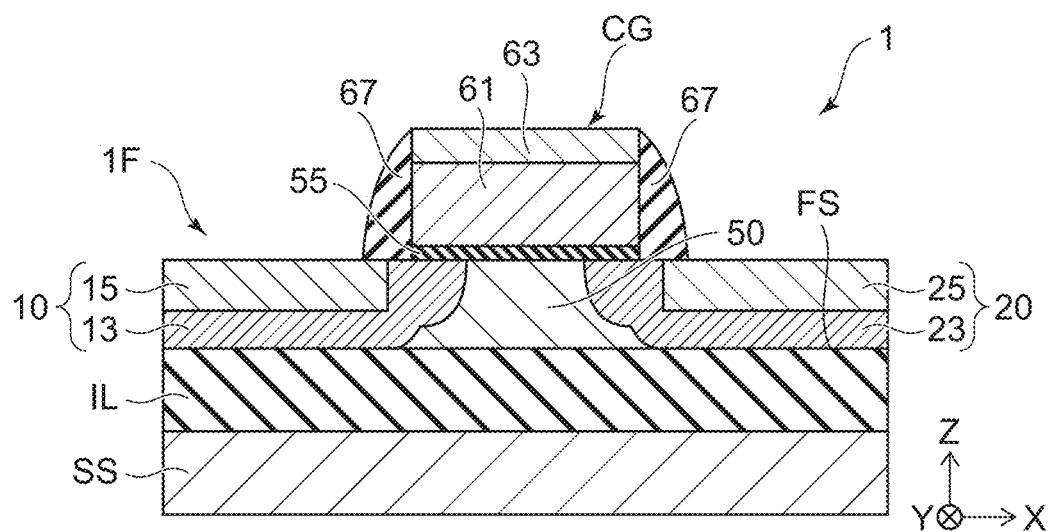

FIGS. 2A and 2B are schematic views showing the semiconductor device 1 according to the embodiment. FIG. 2A is a plan view; and FIG. 2B is a cross-sectional view along A-A line shown in FIG. 2A.

As shown in FIG. 2A, a separation trench SG1 is provided between the first semiconductor part 1F and the second semiconductor part 2F. A separation trench SG2 is provided between the second semiconductor part 2F and the third semiconductor part 3F.

As shown in FIG. 2B, the semiconductor device 1 further includes a semiconductor substrate SS and an insulating layer IL. The semiconductor substrate SS is, for example, a silicon substrate. The insulating layer IL is, for example, a silicon oxide layer. The insulating layer IL is provided on the semiconductor substrate SS. The embodiment is not limited to the example. There may be a structure without the semiconductor substrate SS. For example, there is a case where the insulating layer IL is thick enough, and the semiconductor substrate SS is unnecessary as a supporter. There is another case where not providing the semiconductor substrate SS is advantageous because external noise is not problematic. The insulating layer IL may be another insulating material such as sapphire, etc.

The first semiconductor part 1F is provided on a front surface FS of the insulating layer IL. The first semiconductor part 1F further includes a fifth semiconductor region 50. The fifth semiconductor region 50 is provided between the first semiconductor region 10 and the second semiconductor region 20. The control electrode CG is provided on the fifth semiconductor region 50 with a first insulating film 55 interposed. The first insulating film 55 is, for example, a gate insulating film. The first insulating film 55 is, for example, a silicon oxide film.

The first semiconductor region 10 includes, for example, a source/drain layer (hereinbelow, an SD layer 13) of the first conductivity type and a silicide layer 15. The silicide layer 15 is provided on the SD layer 13. The SD layer 13 is provided between the insulating layer IL and the silicide layer 15. The SD layer 13 includes an extension portion positioned between the fifth semiconductor region 50 and the silicide layer 15. The fifth semiconductor region 50 is, for example, a body region.

The second semiconductor region 20 includes, for example, an SD layer 23 of the first conductivity type and a silicide layer 25. The silicide layer 25 is provided on the SD layer 23. The SD layer 23 is provided between the insulating layer IL and the silicide layer 25. The SD layer 23 includes another extension portion positioned between the fifth semiconductor region 50 and the silicide layer 25.

The control electrode CG includes, for example, a conductive layer 61 and a silicide layer 63. The conductive layer 61 is, for example, a conductive polysilicon layer. The conductive layer 61 is provided on the first insulating film 55. The silicide layer 63 is provided on the conductive layer 61. A sidewall 67 is provided on the side surface of the control electrode CG. The sidewall 67 is, for example, a silicon oxide film. The sidewall 67 may have a stacked structure that includes, for example, a silicon oxide film and a silicon nitride film.

The third semiconductor part 3F also has the same cross-sectional structure along the X-Z plane as the cross-sectional structure shown in FIG. 2B.

Figure 3:
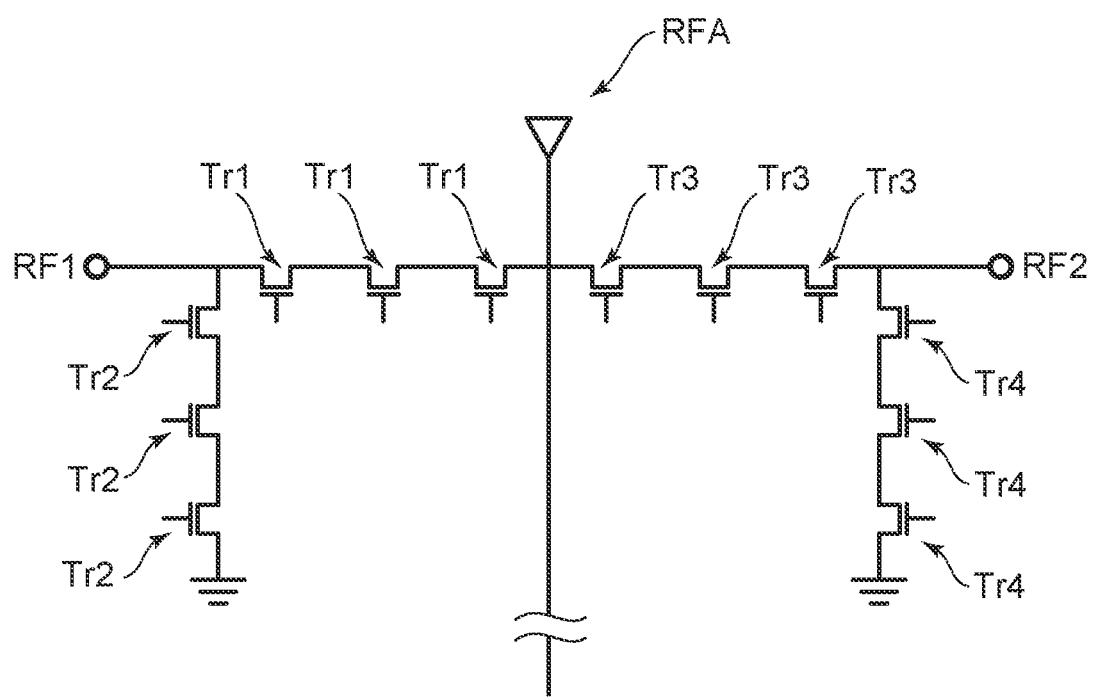
FIG. 3 is a schematic view showing a high-frequency antenna circuit that uses the semiconductor device according to the embodiment.

FIG. 3 is a schematic view showing a high-frequency antenna circuit that includes the semiconductor device according to the embodiment. The high-frequency antenna circuit includes an antenna RFA, multiple high-frequency terminals, and transistors Tr1 to Tr4. The gate control circuit of the transistors Tr1 to Tr4 is not illustrated in FIG. 3.

For example, when the transistor Tr1 is in the on-state, and the transistor Tr2 is in the off-state, a high-frequency signal is transmitted and received between the antenna RFA and a high-frequency terminal RF1. At this time, the transistor Tr3 is in the off-state. Also, the transistor Tr4 is in the on-state, and a high-frequency terminal RF2 is grounded. When a high-frequency signal is transmitted and received between the antenna RFA and the high-frequency terminal RF2, the transistor Tr2 and the transistor Tr3 are in the on-state, and the transistor Tr1 and the transistor Tr4 are in the off-state.

The semiconductor device 1 is included the high-frequency antenna circuit as at least the transistor Tr1 and the transistor Tr3. In other words, the semiconductor device 1 serves as a bidirectional transistor to guide a high-frequency signal that has a large amplitude of oscillation alternately changing positive and negative polarity. In the bidirectional transistor, the source and the drain are switched according to the polarity change. Therefore, the semiconductor device 1 is required to have low loss in the on-state and a high breakdown voltage in the off-state with respect to the voltage level of the high-frequency signal.

Figure 4A:
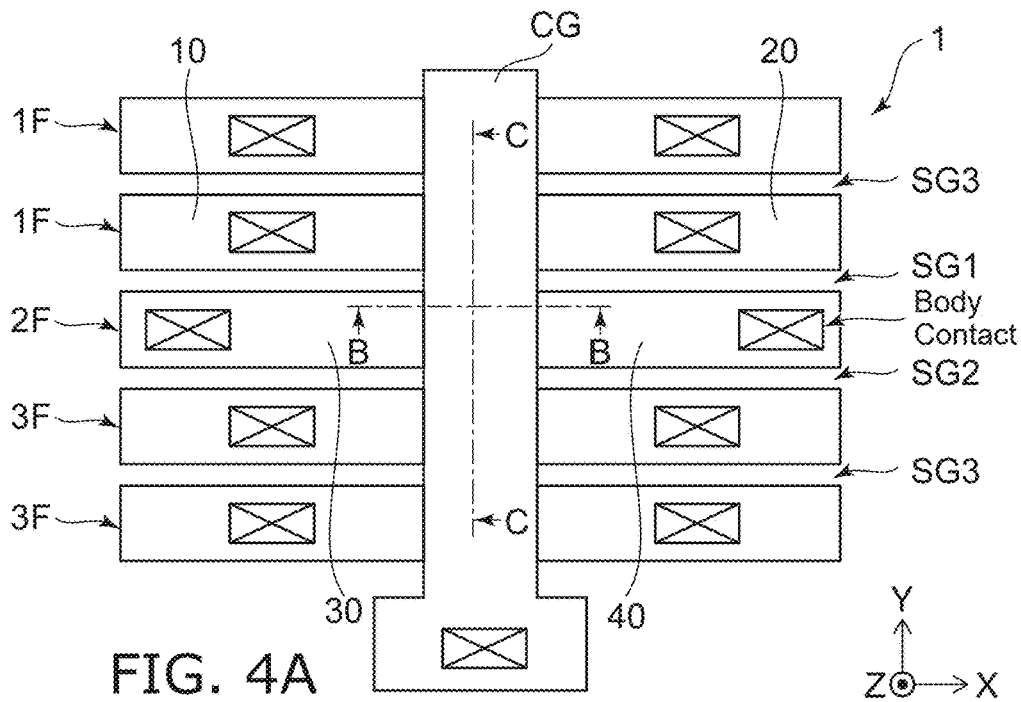
FIGS. 4A to 4C are other schematic views showing the semiconductor device 1 according to the embodiment.
Figure 4B:
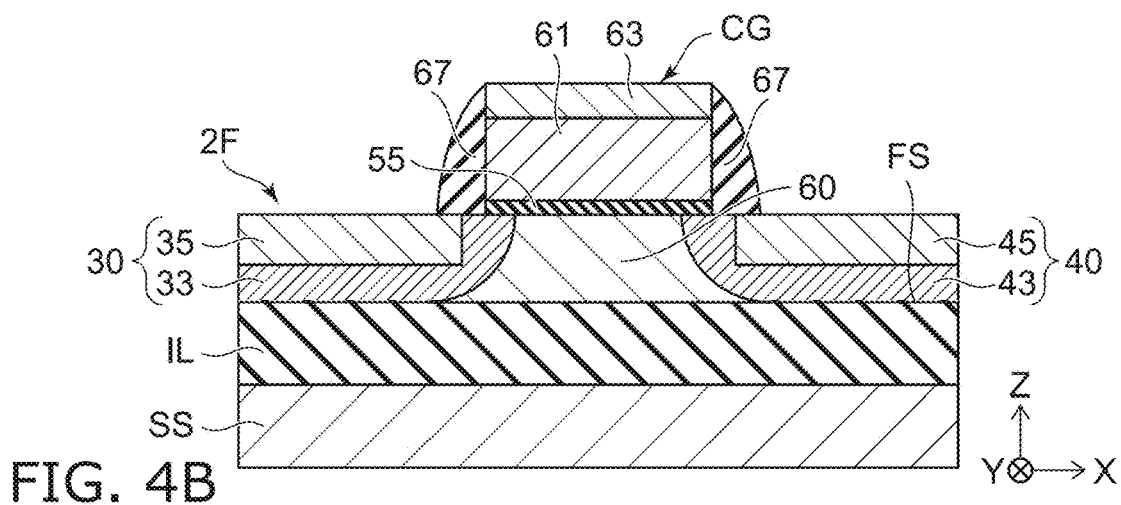
Figure 4C:
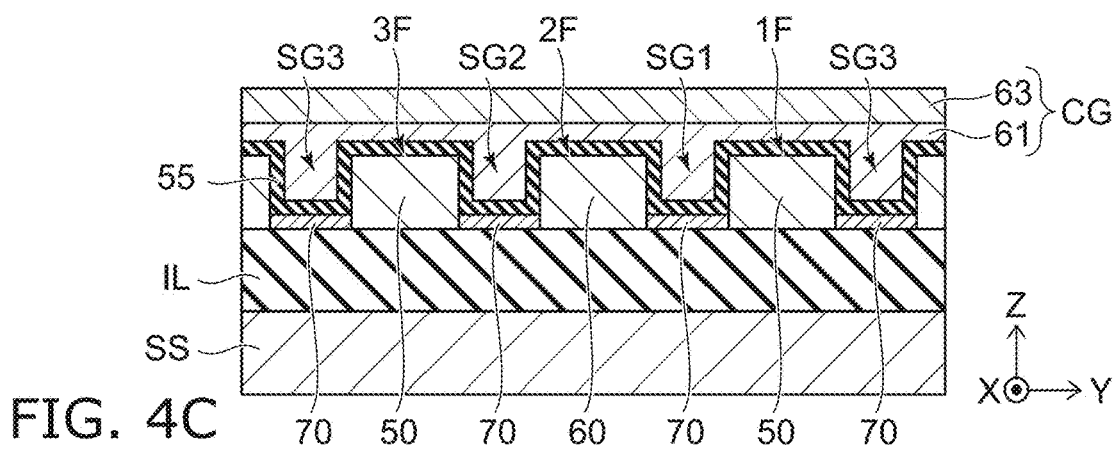

FIGS. 4A to 4C are other schematic views showing the semiconductor device 1 according to the embodiment. FIG. 4A is a plan view; and FIG. 4B is a cross-sectional view along B-B line shown in FIG. 4A. FIG. 4C is a cross-sectional view along C-C line shown in FIG. 4A.

As shown in FIG. 4B, the second semiconductor part 2F is provided on the front surface FS of the insulating layer IL. The second semiconductor part 2F further includes a sixth semiconductor region 60. The sixth semiconductor region 60 is, for example, a body region. The sixth semiconductor region 60 is provided between the third semiconductor region 30 and the fourth semiconductor region 40. The control electrode CG is provided on the sixth semiconductor region 60 with the first insulating film 55 interposed.

The third semiconductor region 30 includes, for example, a body layer 33 of the second conductivity type and a silicide layer 35. The silicide layer 35 is provided on the body layer 33. The body layer 33 is provided between the insulating layer IL and the silicide layer 35. The body layer 33 also includes an extension portion positioned between the sixth semiconductor region 60 and the silicide layer 35. The body layer 33 includes, for example, a second-conductivity-type impurity with a higher concentration than a concentration of a second-conductivity-type impurity in the sixth semiconductor region 60.

The fourth semiconductor region 40 includes, for example, a body layer 43 of the second conductivity type and a silicide layer 45. The silicide layer 45 is provided on the body layer 43. The body layer 43 is provided between the insulating layer IL and the silicide layer 45. The body layer 43 also includes another extension portion positioned between the sixth semiconductor region 60 and the silicide layer 45. The body layer 43 includes, for example, a second-conductivity-type impurity with a higher concentration than the concentration of the second-conductivity-type impurity in the sixth semiconductor region 60.

As shown in FIG. 4C, the fifth semiconductor regions 50 of the first and third semiconductor parts 1F and 3F and the sixth semiconductor region 60 of the second semiconductor part 2F are arranged in the Y-direction. The conductive layer 61 of the control electrode CG includes extension portions extending inside the first separation trench SG1 and the second separation trench SG2, respectively. The extension portions of the conductive layer 61 each are electrically insulated from the fifth and sixth semiconductor regions 50 and 60 by the first insulating film 55. In other words, the semiconductor device 1 has a so-called fin-gate structure.

The semiconductor device 1 further includes a seventh semiconductor region 70 of the second conductivity type. The seventh semiconductor region 70 is provided between the first semiconductor part 1F and the second semiconductor part 2F. Another seventh semiconductor region 70 is provided between the second semiconductor part 2F and the third semiconductor part 3F. The seventh semiconductor region 70 is provided at each bottom of the first and second separation trenches SG1 and SG2. The seventh semiconductor region 70 includes, for example, a second-conductivity-type impurity with a higher concentration than the concentration of the second-conductivity-type impurity in the sixth semiconductor region 60.

The first insulating film 55 covers the fifth semiconductor region 50, the sixth semiconductor region 60, and the seventh semiconductor region 70. The control electrode CG is electrically insulated from the seventh semiconductor region 70 by the first insulating film 55.

The fifth semiconductor region 50 and the sixth semiconductor region 60 are electrically connected by the seventh semiconductor region 70. In other words, the fifth semiconductor region 50 is electrically connected to the second semiconductor part 2F via the seventh semiconductor region 70. In other words, a prescribed potential is supplied from the body contact (see FIG. 1) to the fifth semiconductor region 50 via the second semiconductor part 2F and the seventh semiconductor region 70.

The semiconductor device 1 further includes another first semiconductor part 1F and another third semiconductor part 3F.

The other first semiconductor part 1F is adjacent to the first semiconductor part 1F in the Y-direction. The first semiconductor part 1F is positioned between the other first semiconductor part 1F and the second semiconductor part 2F. A third separation trench SG3 is provided between the first semiconductor part 1F and the other first semiconductor part 1F.

The other third semiconductor part 3F is adjacent to the third semiconductor part 3F in the Y-direction. The third semiconductor part 3F is positioned between the second semiconductor part 2F and the other third semiconductor part 3F. Another third separation trench SG3 is provided between the third semiconductor part 3F and the other third semiconductor part 3F.

Other seventh semiconductor region 70 is provided also at the bottom of the third separation trench SG3. In other words, the fifth semiconductor regions 50 of the adjacent first semiconductor parts 1F and the fifth semiconductor regions 50 of the adjacent third semiconductor parts 3F also are electrically connected by the seventh semiconductor regions 70.

Figure 5A:
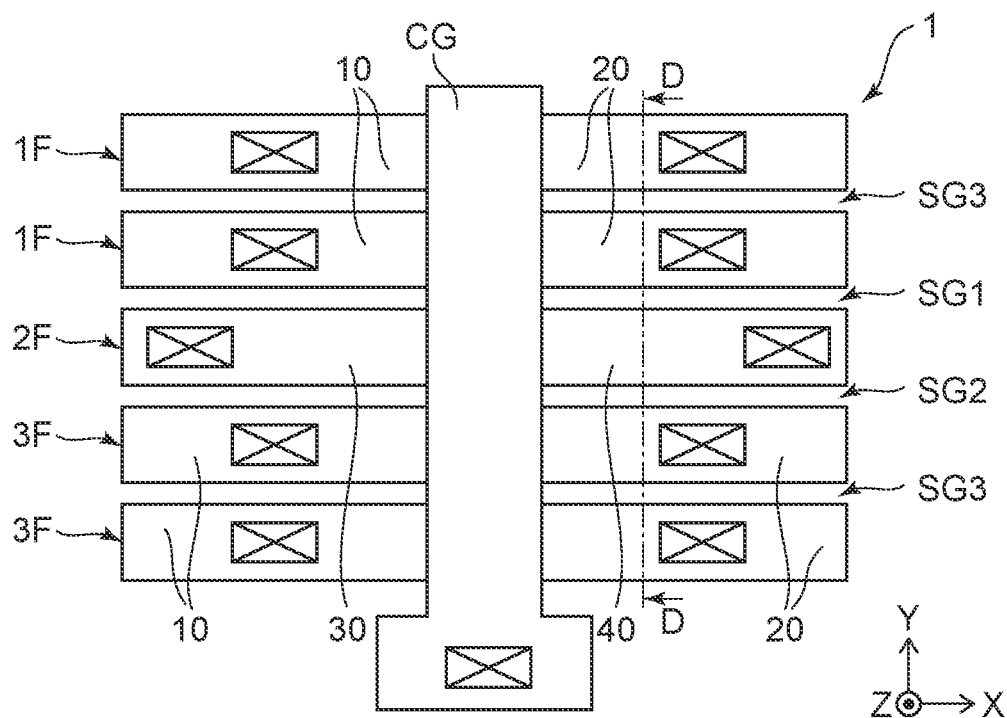
FIGS. 5A and 5B are other schematic views showing the semiconductor device according to the embodiment.
Figure 5B:
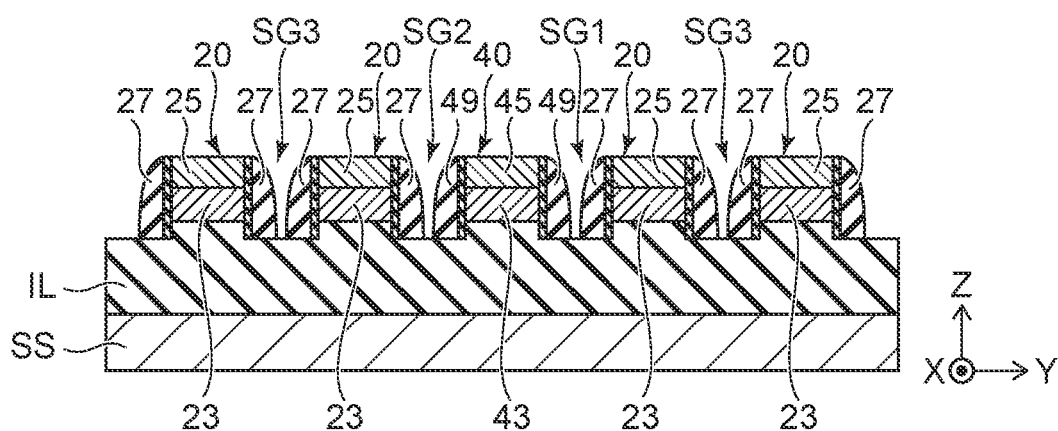

FIGS. 5A and 5B are other schematic views showing the semiconductor device 1 according to the embodiment. FIG. 5A is a plan view; and FIG. 5B is a cross-sectional view along D-D line shown in FIG. 5A.

As shown in FIG. 5B, a sidewall 49 is provided on each surface of the fourth semiconductor region 40 in the first and second separation trenches SG1 and SG2. A sidewall 27 is provided on each side surface of the second semiconductor regions 20 in the first to third separation trenches SG1 to SG3. The sidewalls 27 and 49 are, for example, silicon oxide films.

In the example, the seventh semiconductor region 70 is not provided between the adjacent second semiconductor regions 20. The seventh semiconductor region 70 also is not provided between the second semiconductor region 20 and the fourth semiconductor region 40. Moreover, the seventh semiconductor region 70 is not provided between the adjacent first semiconductor regions 10 and between the first semiconductor region 10 and the third semiconductor region 30. In other words, the seventh semiconductor regions 70 are selectively provided under the control electrode CG at the bottom of the first to third separation trenches SG1 to SG3.

Figure 6A:
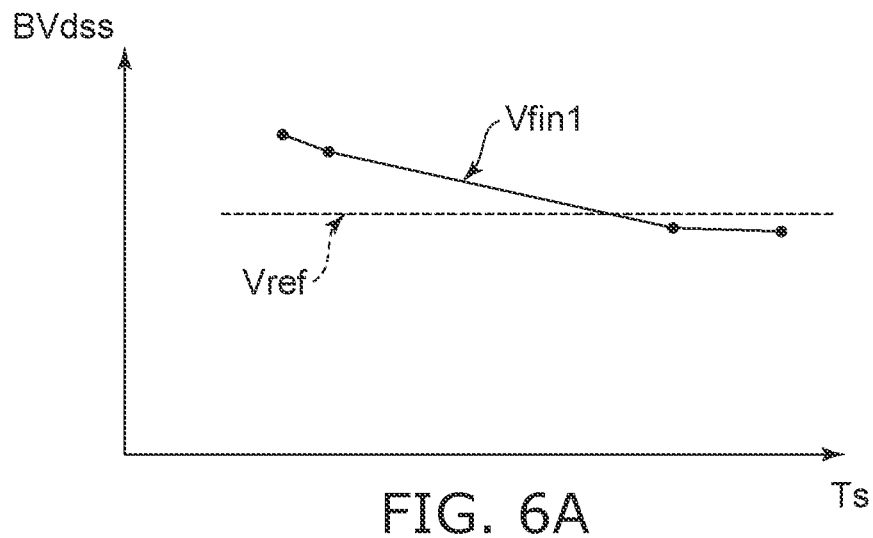
FIGS. 6A and 6B are graphs showing characteristics of the semiconductor device according to the embodiment.
Figure 6B:
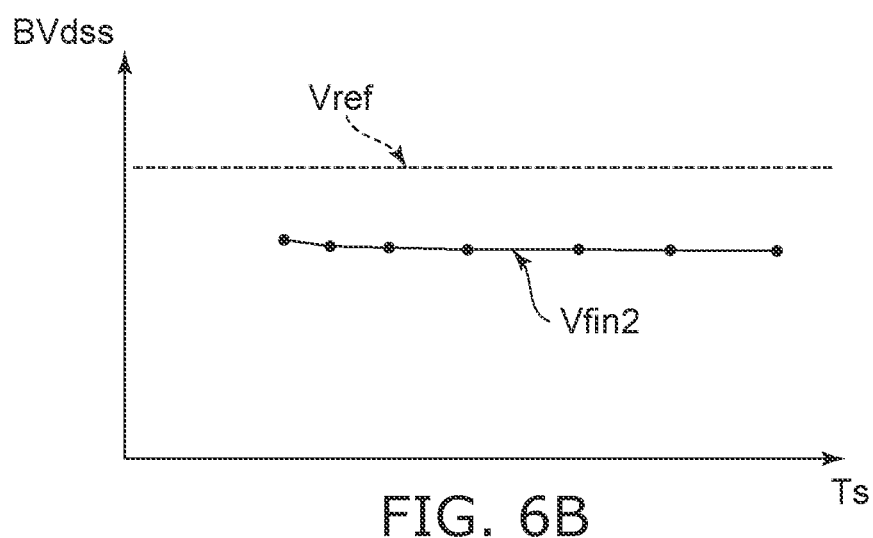

FIG. 6A is a graph showing a characteristic of the semiconductor device 1 according to the embodiment. FIG. 6B is a graph showing a characteristic of a semiconductor device according to a comparative example. The vertical axis is a drain-source breakdown voltage BVdss. The horizontal axis is a thickness Ts in the Z-direction of each semiconductor part.

In FIGS. 6A and 6B, a reference breakdown voltage Vref is shown. Vref is a breakdown voltage of a transistor that includes a planar MOS gate (hereinbelow, a planar transistor). The planar transistor does not include separation trenches that separate the semiconductor parts. Vfin1 is the breakdown voltage of the semiconductor device 1. Vfin2 is the breakdown voltage of the semiconductor device according to the comparative example. In the semiconductor device according to the comparative example, the seventh semiconductor region 70 is not included, and the fifth semiconductor region 50 is provides with a floating potential.

As shown in FIG. 6A, Vfin1 increases as the thickness Ts decreases, and Vfin1 exceeds Vref. On the other hand, in FIG. 6B, Vfin2 is less than Vref and does not exceed Vref as the thickness Ts decreases. In other words, in the semiconductor device 1, the potential of the body region can be stabilized by the seventh semiconductor region 70, and increases the source-drain the breakdown voltage BVdss.

Figure 7A:
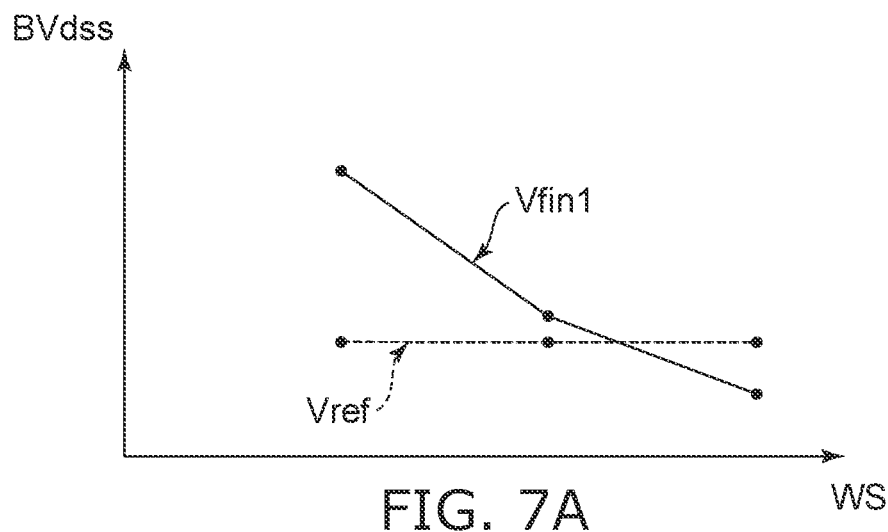
FIGS. 7A and 7B are graphs showing other characteristics of the semiconductor device according to the embodiment.
Figure 7B:
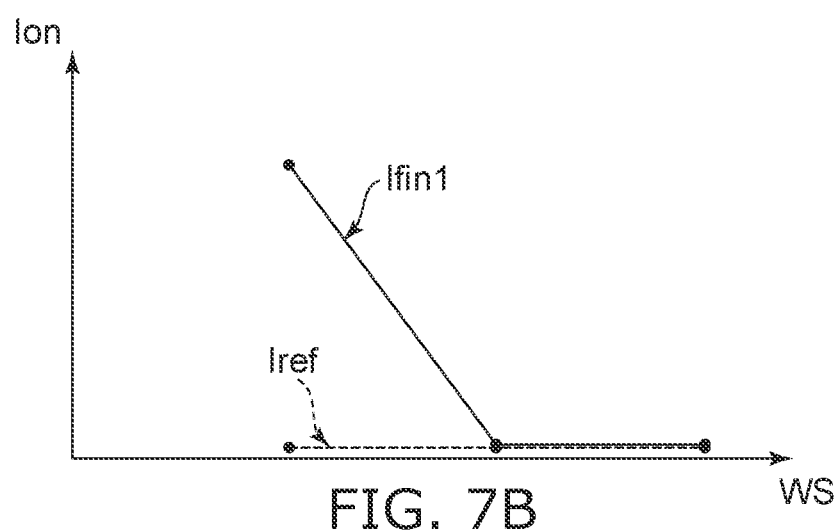

FIGS. 7A and 7B are graphs showing other characteristics of the semiconductor device according to the embodiment. FIG. 7A illustrates the relationship between the breakdown voltage BVdss and a width WS in the Y-direction of each semiconductor part. The width WS of each semiconductor part is equal to the widths in the Y-direction of the separation trenches. FIG. 7B illustrates the relationship between WS and an on-current Ion.

As shown in FIG. 7A, the breakdown voltage BVdss increases as WS decreases. For example, each of the semiconductor parts is provided so that BVdss exceeds Vref.

As shown in FIG. 7B, as WS decreases, the on-current Ion, i.e., a drain current Ifin1 in the on-state, greatly increases compared to a drain current Iref of the planar transistor. By reducing WS, it is possible to increase the number of the first and third semiconductor parts 1F and 3F that can be provided on the insulating layer IL. The gate width of the semiconductor device 1 can be increased thereby, and thus, the on-current increases.

Figure 8A:
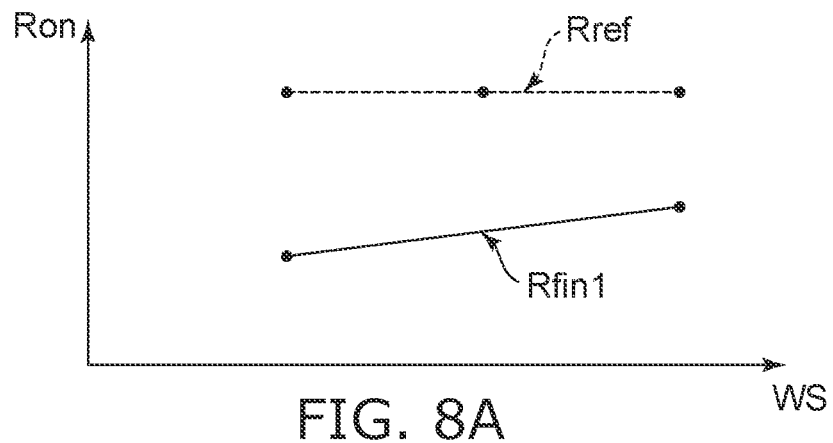
FIGS. 8A to 8C are graphs showing yet other characteristics of the semiconductor device according to the embodiment.
Figure 8B:
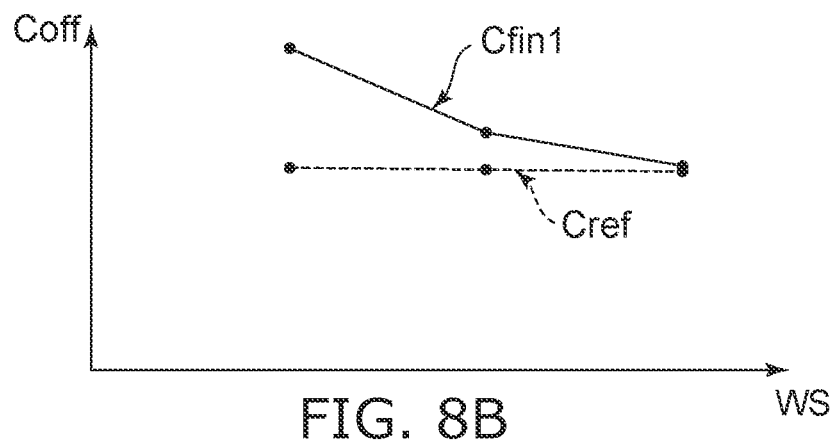
Figure 8C:
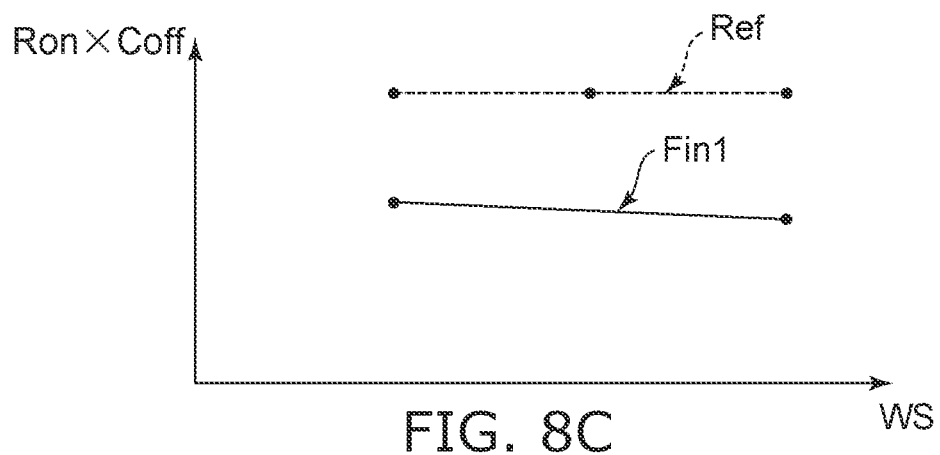

FIGS. 8A to 8C are graphs showing other characteristics of the semiconductor device 1 according to the embodiment. FIG. 8A illustrates the relationship between WS and an on-resistance Ron. FIG. 8B illustrates the relationship between WS and a gate capacitance Coff in the off-state. FIG. 8C illustrates the relationship between WS and a performance index Ron×Coff.

As shown in FIG. 8A, the on-resistance Ron decreases as WS decreases. The on-resistance Ron of the semiconductor device 1 is less than an on-resistance Rref of the planar transistor. The on-resistance Ron of the semiconductor device 1 corresponds to a larger on-current thereof.

In FIG. 8B, the gate capacitances Coff of the semiconductor device 1 and the planar transistor are shown by Cfin1 and Cref, respectively. As shown in FIG. 8B, Cfin1 increases as WS decreases. Cfin1 is greater than Cref. Such a characteristic represents a feature of fin-gate transistors.

In FIG. 8, Ron×Coff of the semiconductor device 1 is denoted by "Fin1". Ron×Coff of the planar transistor is denoted by "Ref". As shown in FIG. 8C, Ron×Coff of the semiconductor device 1 is less than the Ron×Coff of the planar transistor. Such characteristic of the semiconductor device 1 corresponds to the on-resistance thereof that is drastically smaller compared to the on-resistance of the planar transistor. The switching loss decreases as the performance index Ron×Coff decreases. Therefore, the switching loss of the high-frequency signal can be reduced in the semiconductor device 1 compared to a planar transistor.

Figure 9A:
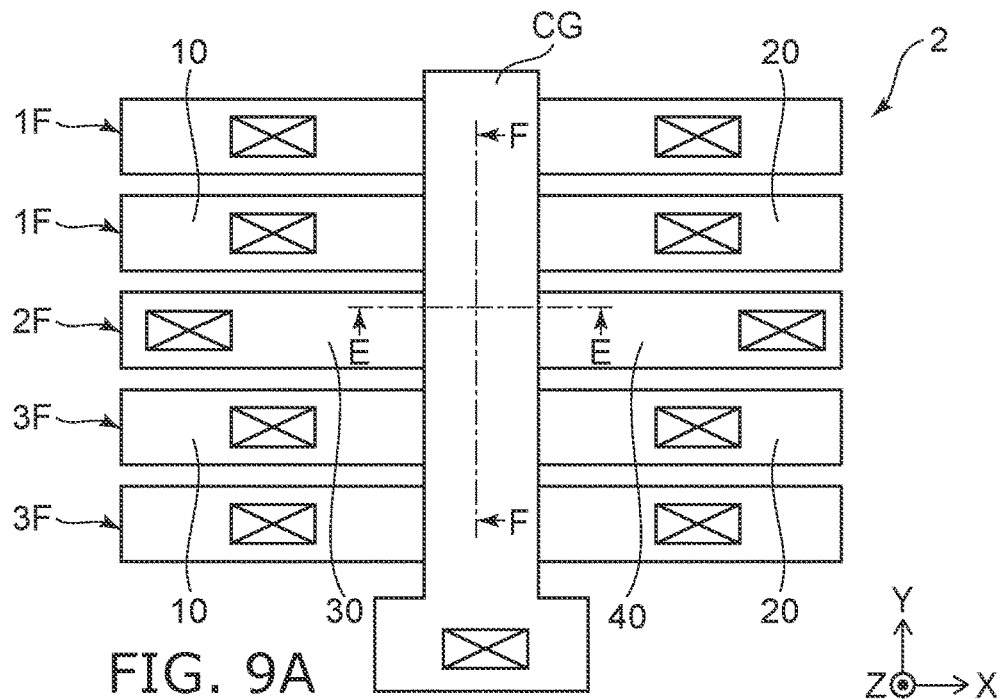
FIGS. 9A to 9C are schematic views showing a semiconductor device according to a first modification of the embodiment.
Figure 9B:
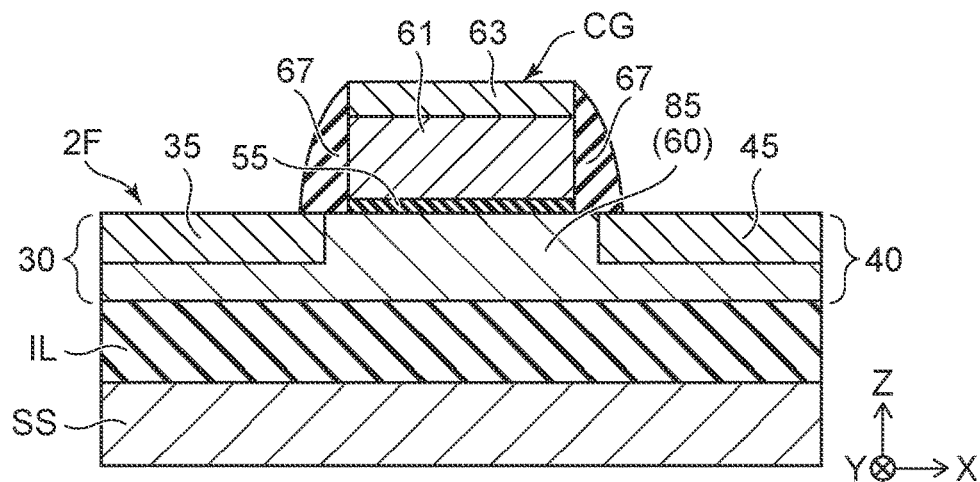
Figure 9C:
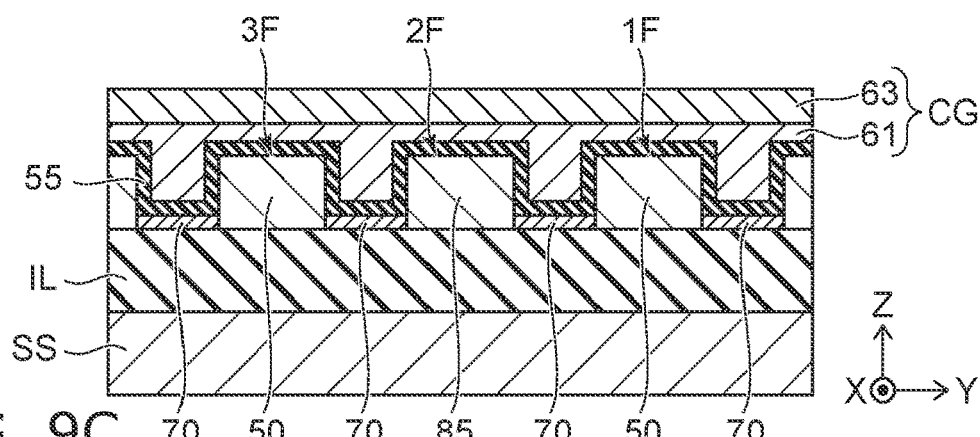

FIGS. 9A to 9C are schematic views showing a semiconductor device 2 according to a first modification of the embodiment. FIG. 9A is a plan view; and FIG. 9B is a cross-sectional view along E-E line shown in FIG. 9A. FIG. 9C is a cross-sectional view along F-F line shown in FIG. 9A.

As shown in FIG. 9B, the second semiconductor part 2F includes a body layer 85 of the second conductivity type provided on the insulating layer IL. The body layer 85 is shared by the third semiconductor region 30, the fourth semiconductor region 40, and the sixth semiconductor region 60 (see FIG. 4B).

The third semiconductor region 30 includes the silicide layer 35 provided on the body layer 85. The fourth semiconductor region 40 includes the silicide layer 45 provided on the body layer 85. The control electrode CG is provided on the body layer 85 with the first insulating film 55 interposed.

In the example, the first semiconductor part 1F and the third semiconductor part 3F have the same structures as the structure shown in FIG. 2B; and the structure of the second semiconductor part 2F is different from the structure shown in FIG. 4B.

As shown in FIG. 9C, the fifth semiconductor regions 50 of the first and third semiconductor parts 1F and 3F are electrically connected to the body layer 85 via the seventh semiconductor regions 70. A prescribed potential is supplied from the body contact (see FIG. 1) to the fifth semiconductor region 50 via the seventh semiconductor region 70 and the body layer 85.

Figure 10A:
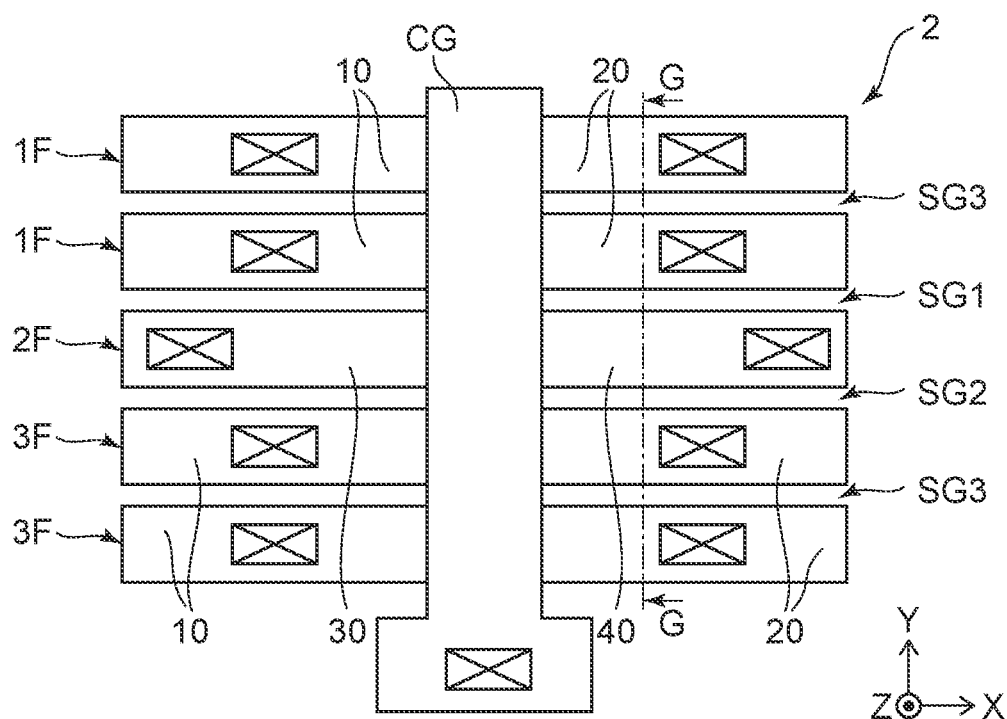
FIGS. 10A and 10B are other schematic views showing the semiconductor device according to the first modification of the embodiment.
Figure 10B:
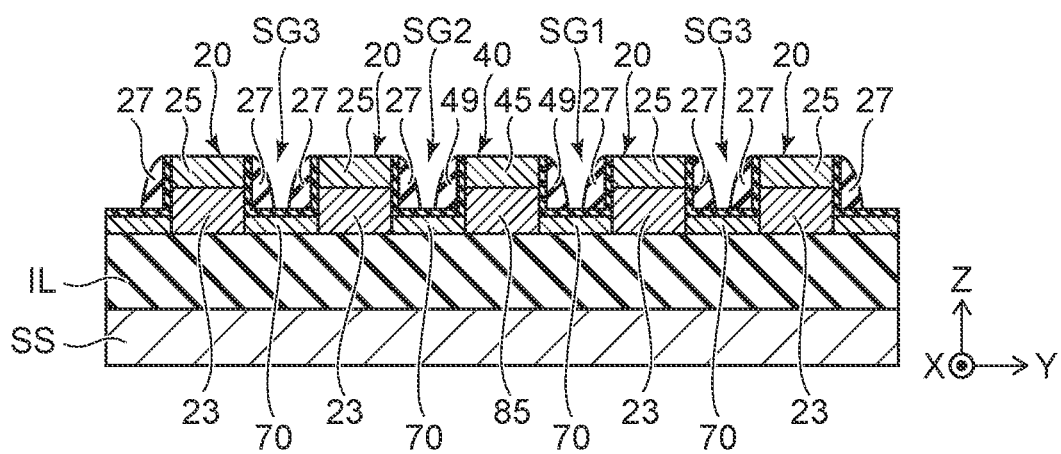

FIGS. 10A and 10B are other schematic views showing the semiconductor device 2 according to the first modification of the embodiment. FIG. 10A is a plan view; and FIG. 10B is a cross-sectional view along G-G line shown in FIG. 10A.

As shown in FIG. 10B, the seventh semiconductor region 70 is provided between the adjacent second semiconductor regions 20 and between the second semiconductor region 20 and the fourth semiconductor region 40. Moreover, the seventh semiconductor region 70 is provided between the adjacent first semiconductor regions 10 and between the first semiconductor region 10 and the third semiconductor region 30.

When forming the structure in which the seventh semiconductor region 70 is not provided between the adjacent second semiconductor regions 20 or between the second semiconductor region 20 and the fourth semiconductor region 40 (see FIG. 5B), the seventh semiconductor region 70 is selectively removed. Such a process can be omitted in the example. The embodiment is not limited to the example described above. For example, there may be a case in which the seventh semiconductor region 70 is provided at the entire bottom surface of at least one of the separation trenches SG1 to SG3.

Figure 11:
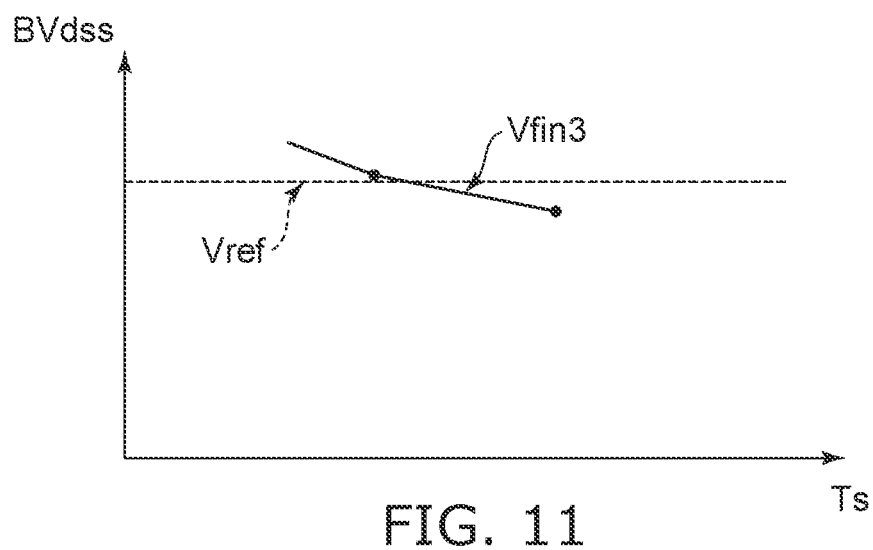
FIG. 11 is a graph showing a characteristic of the semiconductor device according to the first modification of the embodiment.

FIG. 11 is a graph showing a characteristic of the semiconductor device 2 according to the first modification of the embodiment. The vertical axis is the breakdown voltage BVdss. The horizontal axis is the thickness Ts in the Z-direction of each semiconductor part. In FIG. 11, the breakdown voltages of the semiconductor device 3 and the planar transistor are denoted by "Vfin3" and "Vref", respectively.

As shown in FIG. 11, the breakdown voltage of the semiconductor device 3 exceeds the breakdown voltage of the planar transistor as Ts decreases. Thus, the seventh semiconductor region 70 can remain between the adjacent second semiconductor regions 20 and between the second semiconductor region 20 and the fourth semiconductor region 40.

Figure 12A:
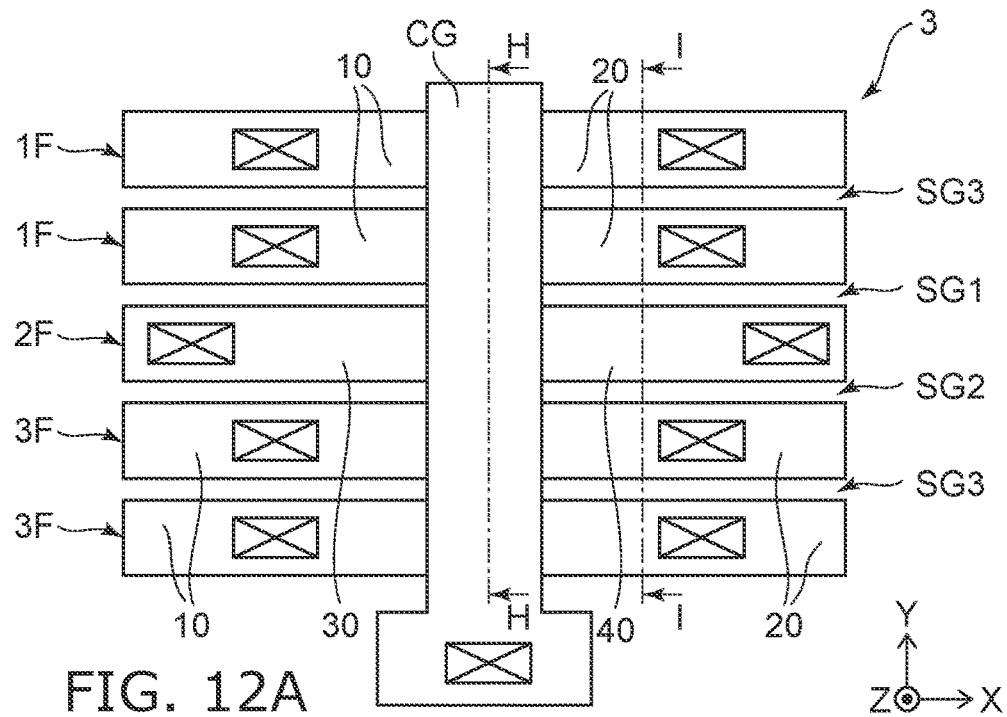
FIGS. 12A to 12C are schematic views showing a semiconductor device according to a second modification of the embodiment.
Figure 12B:
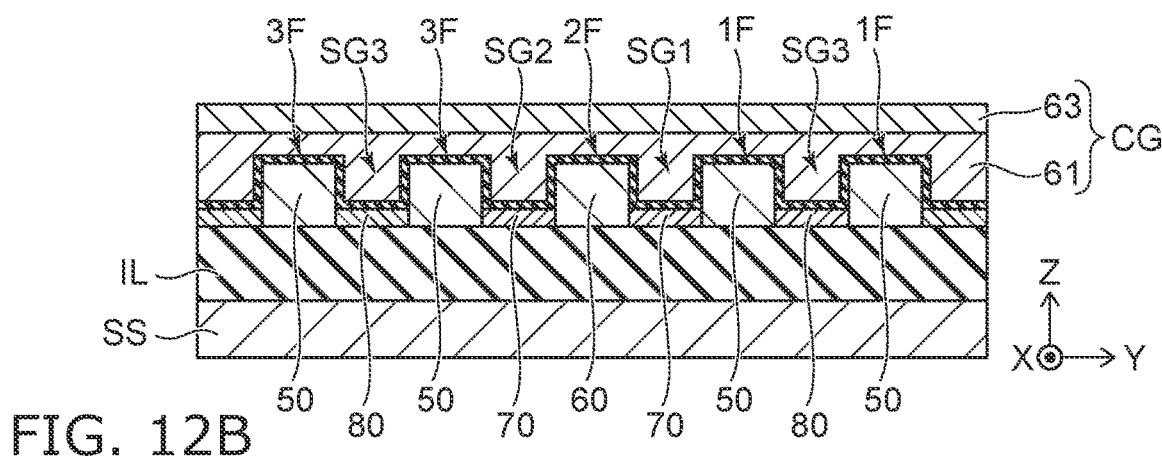
Figure 12C:
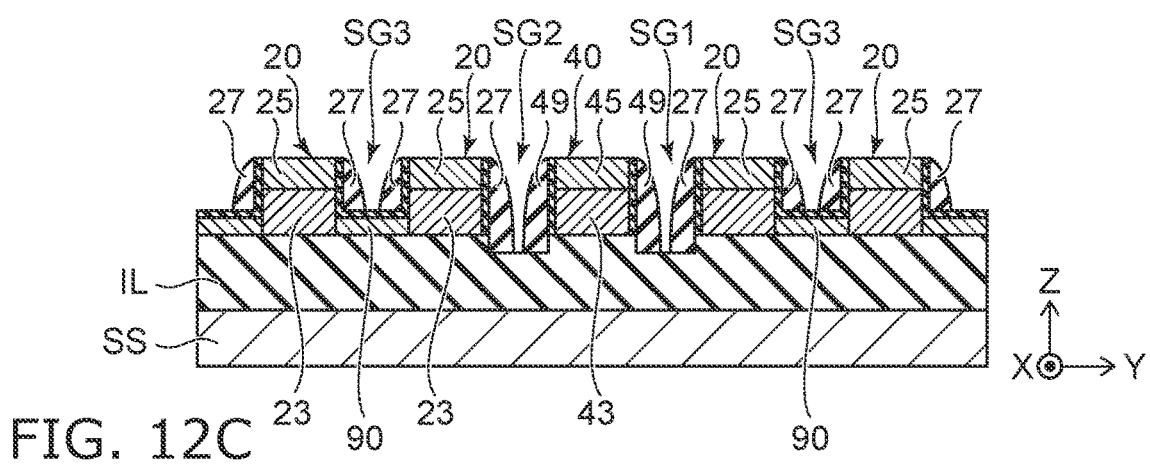

FIGS. 12A to 12C are schematic views showing a semiconductor device 3 according to a second modification of the embodiment. FIG. 12A is a plan view; and FIG. 12B is a cross-sectional view along H-H line shown in FIG. 12A. FIG. 12C is a cross-sectional view along I-I line shown in FIG. 12A.

As shown in FIG. 12B, the seventh semiconductor regions 70 are provided at the bottoms of the first and second separation trenches SG1 and SG2 below the control electrode CG. An eighth semiconductor region 80 of the second conductivity type is provided at the bottom of the third separation trench SG3. The eighth semiconductor region 80 is provided between the adjacent fifth semiconductor regions 50. The eighth semiconductor region 80 includes a second-conductivity-type impurity with, for example, the same concentration as the concentration of the second-conductivity-type impurity in the fifth semiconductor region 50.

As shown in FIG. 12C, the seventh semiconductor region 70 is not provided in the region in which the control electrode CG is not provided, and the insulating layer IL is exposed at the bottoms of the first and second separation trenches SG1 and SG2. In other words, the seventh semiconductor region 70 is selectively provided under the control electrode CG.

On the other hand, a ninth semiconductor region 90 is provided at the bottom of the third separation trench SG3. The ninth semiconductor region 90 is provided between the adjacent second semiconductor regions 20 and is electrically connected to the second semiconductor regions 20. The ninth semiconductor region 90 also is provided between the adjacent first semiconductor regions 10 and is electrically connected to the first semiconductor regions 10. That is, the eighth semiconductor region 80 is provided at the bottom of the third separation trench SG3 between two ninth semiconductor regions 90 arranged in the X-direction.

The ninth semiconductor region 90 serves as a source/drain region; and the eighth semiconductor region 80 serves as a body region. In other words, a transistor also is formed at the bottom of the third separation trench SG3. The on-current of the semiconductor device 3 can be further increased thereby.

Figure 13A:
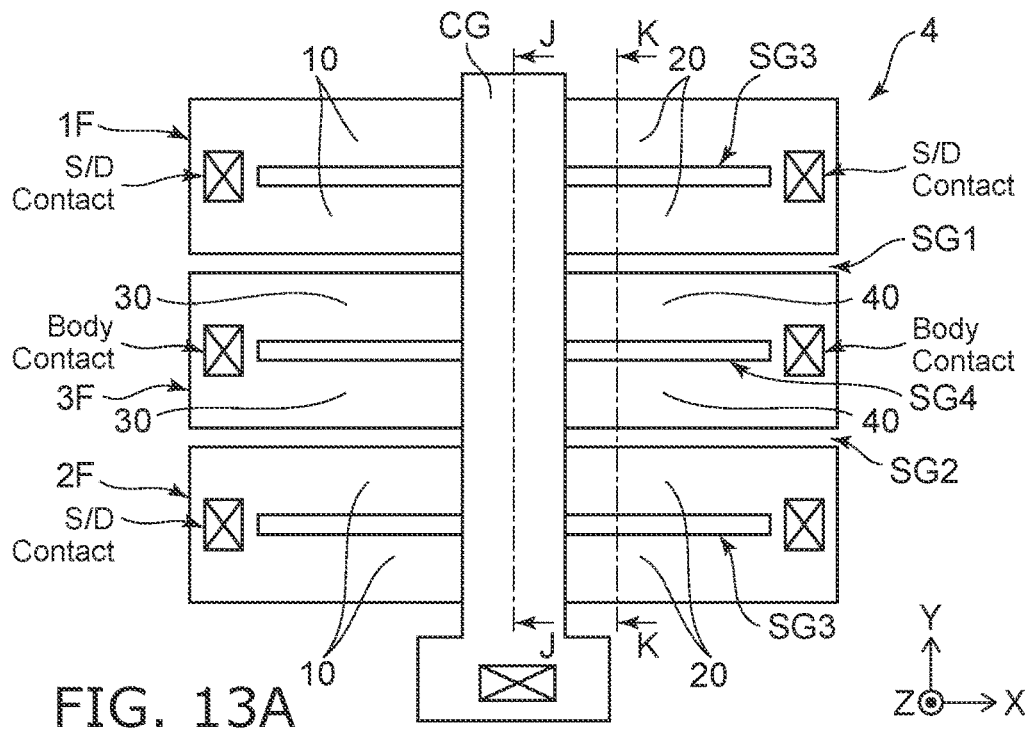
FIGS. 13A to 13C are schematic views showing a semiconductor device according to a third modification of the embodiment.
Figure 13B:
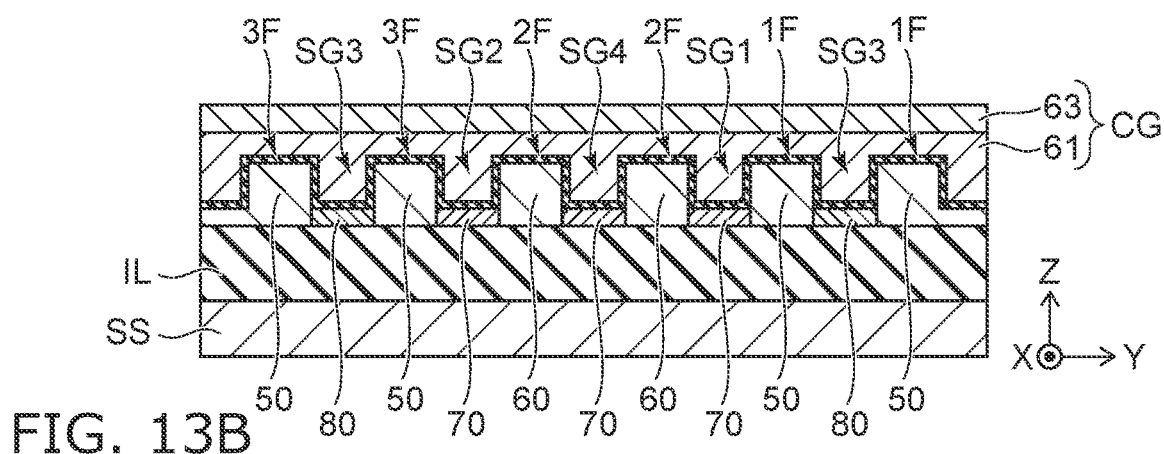
Figure 13C:
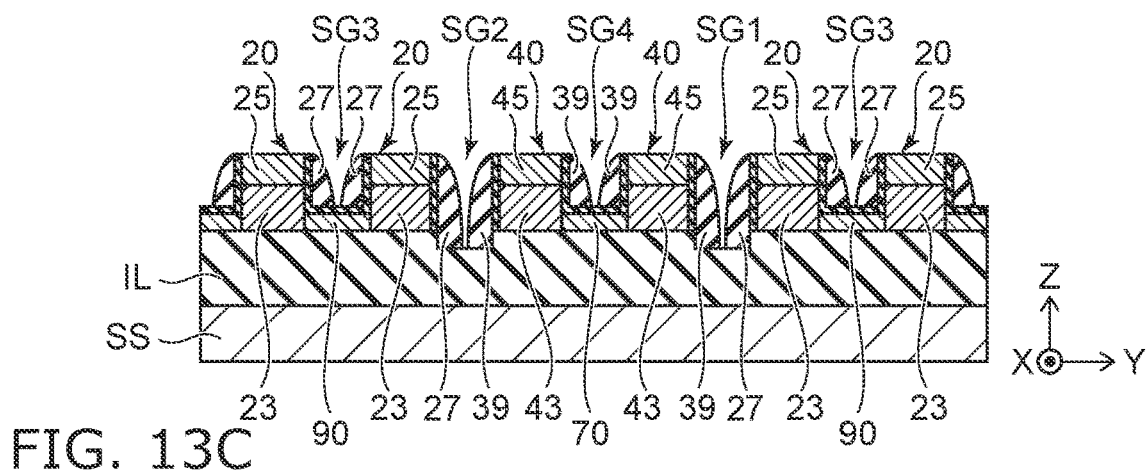

FIGS. 13A to 13C are schematic views showing a semiconductor device 4 according to a third modification of the embodiment. FIG. 13A is a plan view; and FIG. 13B is a cross-sectional view along J-J line shown in FIG. 13A. FIG. 13C is a cross-sectional view along K-K line shown in FIG. 13A.

As shown in FIG. 13A, two second semiconductor parts 2F are provided between multiple first semiconductor parts 1F and multiple third semiconductor parts 3F. The two second semiconductor parts 2F are arranged in the Y-direction. A fourth separation trench SG4 is provided between the two second semiconductor parts 2F.

Body contacts (see FIG. 1) are electrically connected to the two second semiconductor parts 2F. The source/drain contacts (S/D Contact) are electrically connected to the multiple first semiconductor parts 1F and the multiple third semiconductor parts 3F. Such a configuration is advantageous in a case where the widths WS in the Y-direction of the first to third semiconductor parts 1F to 3F are narrow, and the semiconductor parts are electrically connected to the upper layer wiring (not illustrated).

As shown in FIG. 13B, the seventh semiconductor regions 70 and the eighth semiconductor region 80 are provided under the control electrode CG. The seventh semiconductor regions 70 are provided at the bottoms of the first separation trench SG1, the second separation trench SG2, and a fourth separation trench SG5. The eighth semiconductor region 80 is provided at the bottom of the third separation trench SG3.

One of the seventh semiconductor regions 70 electrically connects the sixth semiconductor region 60 of the second semiconductor part 2F. Another one of the seventh semiconductor regions 70 electrically connects the adjacent fifth semiconductor regions 50 of the first and third semiconductor parts 1F and 3F. The eighth semiconductor region 80 electrically connects the adjacent fifth semiconductor regions 50.

As shown in FIG. 13C, the insulating layer IL is exposed at the bottom of the first and second separation trenches SG1 and SG2 in the region in which the control electrode CG is not provided. The eighth semiconductor region 80 is provided at the bottom of the third separation trench SG3. The eighth semiconductor region 80 electrically connects the adjacent second semiconductor regions 20. The eighth semiconductor region 80 also is provided between the adjacent first semiconductor regions 10 and electrically connects the adjacent first semiconductor regions 10.

Other one of the seventh semiconductor regions 70 is provided at the bottom of the fourth separation trench SG4. The seventh semiconductor region 70 electrically connects the fourth semiconductor regions 40 of the adjacent second semiconductor parts 2F. The seventh semiconductor region 70 also is provided between the third semiconductor regions 30 of the adjacent second semiconductor parts 2F and electrically connects the adjacent third semiconductor regions 30.

Figure 14A:
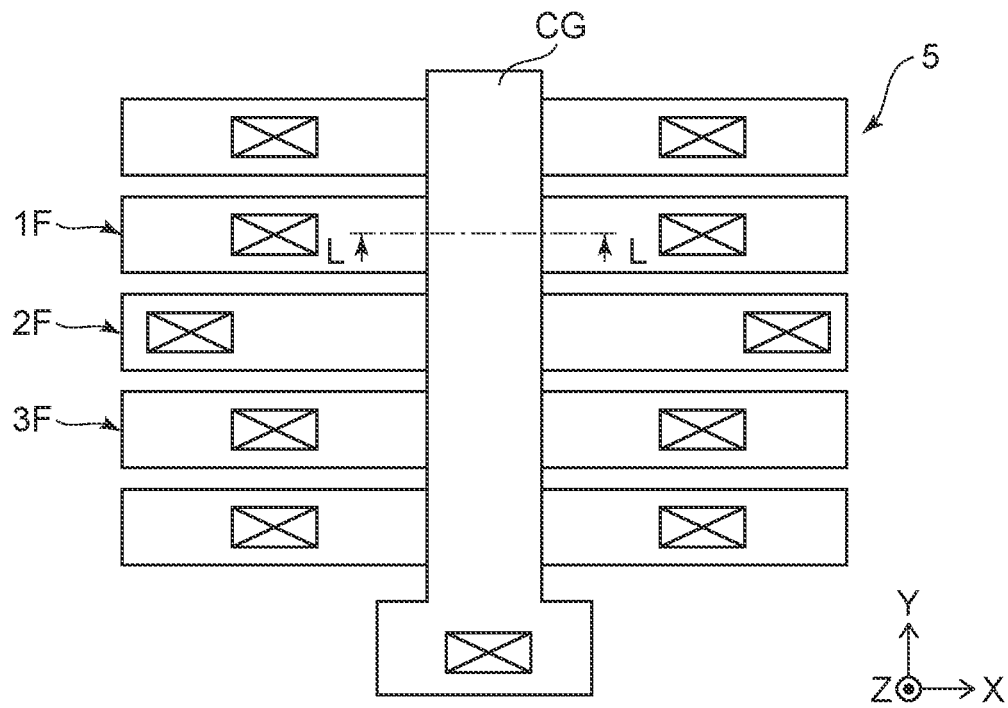
FIGS. 14A and 14B are schematic views showing a semiconductor device according to a fourth modification of the embodiment.
Figure 14B:
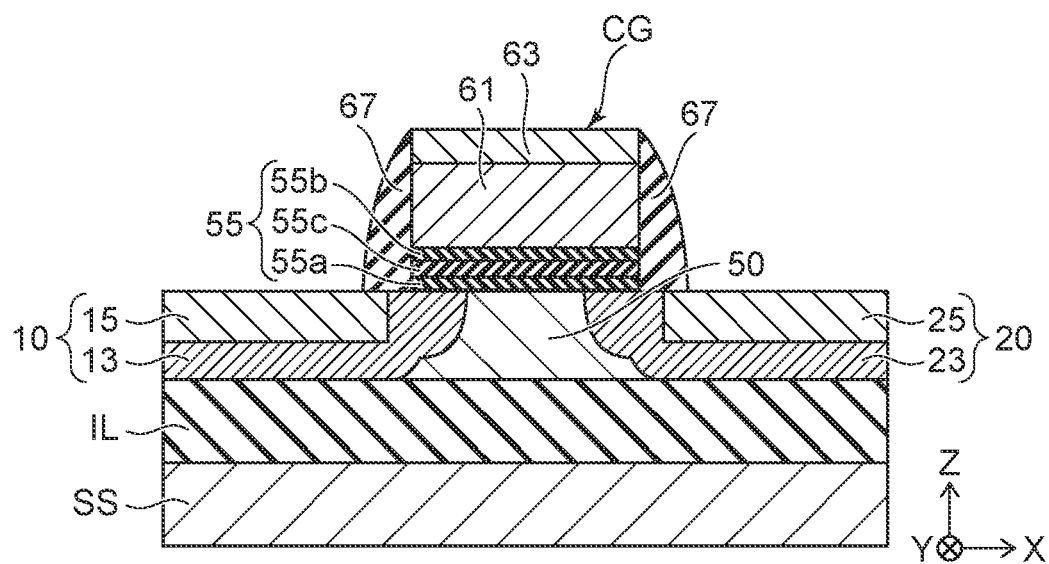

FIGS. 14A and 14B are schematic views showing a semiconductor device 5 according to a fourth modification of the embodiment. FIG. 14A is a plan view; and FIG. 14B is a cross-sectional view along L-L line shown in FIG. 14A.

As shown in FIG. 14B, in the example, the first insulating film 55 has a stacked structure that includes a first film 55a, a second film 55b, and a third film 55c. The first insulating film 55 is provided between the control electrode CG and the fifth semiconductor region 50 of the first semiconductor part 1F. The first film 55a is provided on the fifth semiconductor region 50. The second film 55b is provided between the first film 55a and the control electrode CG. The third film 55c is provided between the first film 55a and the second film 55b.

The first film 55a includes, for example, the same composition as a composition of the second film 55b. The first film 55a and the second film 55b are, for example, silicon oxide films. The third film 55c is different in a composition from the first and second films 55a and 55b. The third film 55c is, for example, a silicon nitride film.

A method for manufacturing the semiconductor device 5 according to the fourth modification of the embodiment is described below with reference to FIGS. 15A to 18C. FIGS. 15A to 16C and FIGS. 17B to 18C are schematic cross-sectional views showing manufacturing processes of the semiconductor device 5. FIG. 17A is a schematic plan view.

Figure 15A:
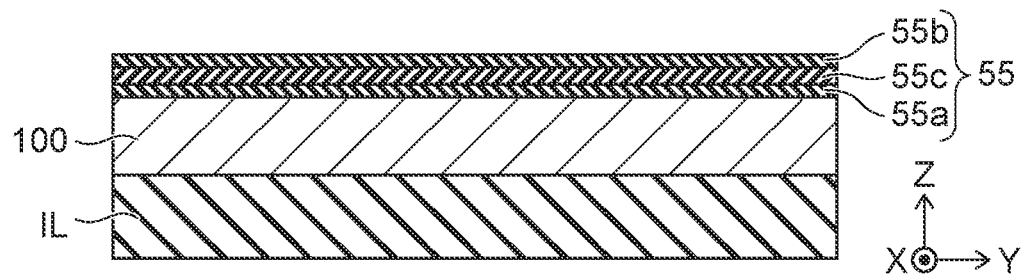
FIGS. 15A to 18C are schematic cross-sectional views showing manufacturing processes of the semiconductor device according to the fourth modification of the embodiment.

As shown in FIG. 15A, a semiconductor layer 100 of the second conductivity type is formed on the insulating layer IL. The semiconductor substrate SS is not illustrated in FIG. 15A. The semiconductor layer 100 is, for example, an SOI (Silicon on Insulator) layer.

The first insulating film 55 is provided on the semiconductor layer 100. The first film 55a is formed by, for example, thermal oxidation of the semiconductor layer 100. The second film 55b and the third film 55c are formed, for example, using CVD (Chemical Vapor Deposition). The third film 55c is deposited on the first film 55a. The second film 55b is deposited on the third film 55c.

Figure 15B:
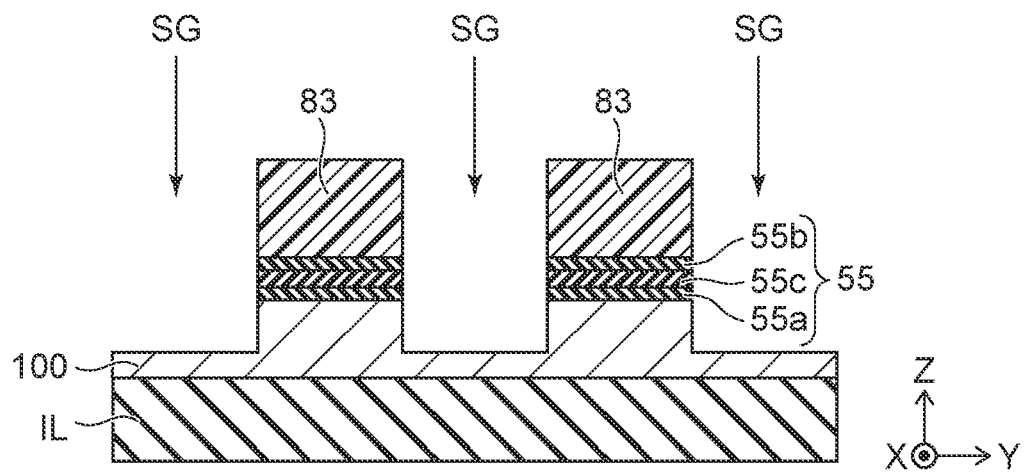

As shown in FIG. 15B, an etching mask 83 is formed on the first insulating film 55; and the first insulating film 55 and the semiconductor layer 100 are selectively removed. The multiple separation trenches SG are formed thereby. The semiconductor layer 100 is removed so that a part of the semiconductor layer 100 remains on the insulating layer IL. The etching mask 83 is, for example, a photoresist.

Figure 15C:
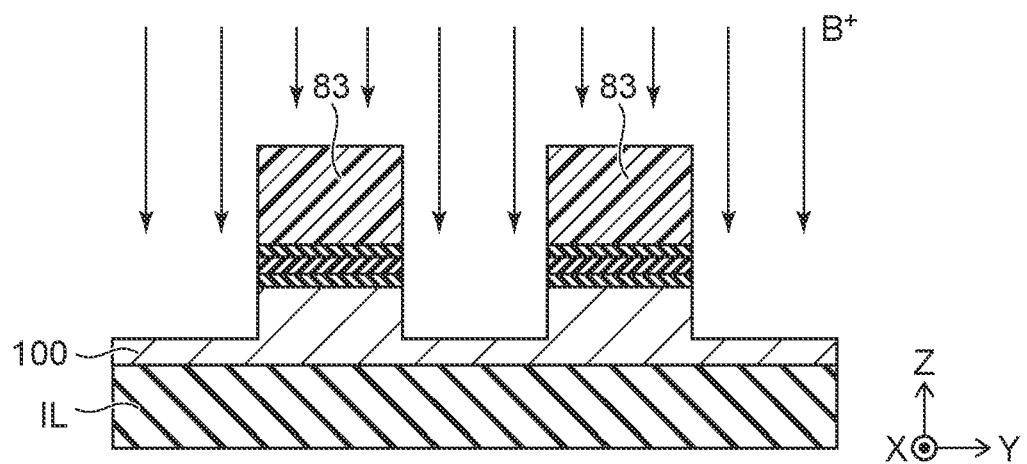

As shown in FIG. 15C, a second-conductivity-type impurity such as boron (B) or the like is ion-implanted into the semiconductor layer 100. The second-conductivity-type impurity is selectively ion-implanted into the bottom surfaces of the separation trenches SG. The etching mask 83 also is used as an ion implantation mask.

Figure 16A:
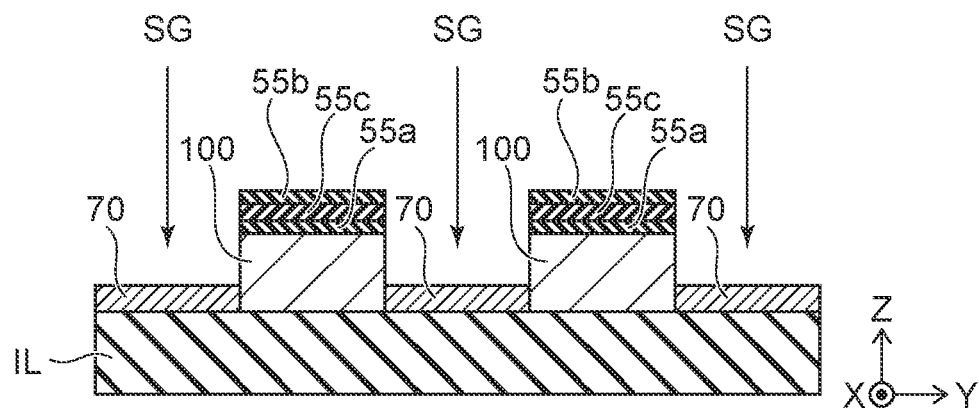
Figure 17A:
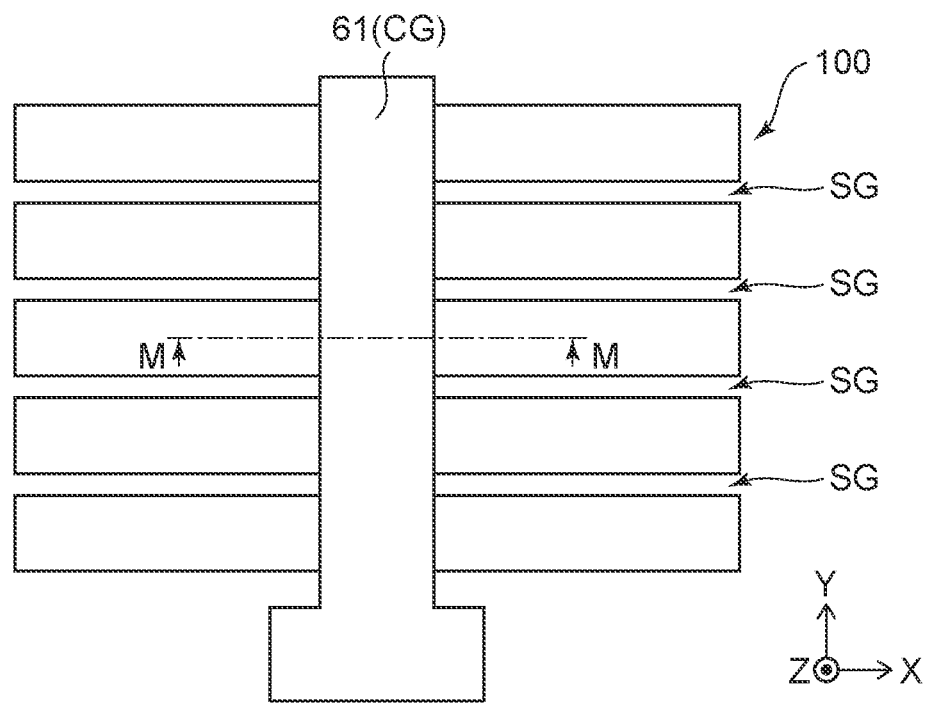

As shown in FIG. 16A, the seventh semiconductor regions 70 are formed at the bottoms of the separation trenches SG. The ion-implanted second-conductivity-type impurity is activated by heat treatment. The seventh semiconductor regions 70 are formed thereby.

Figure 16B:
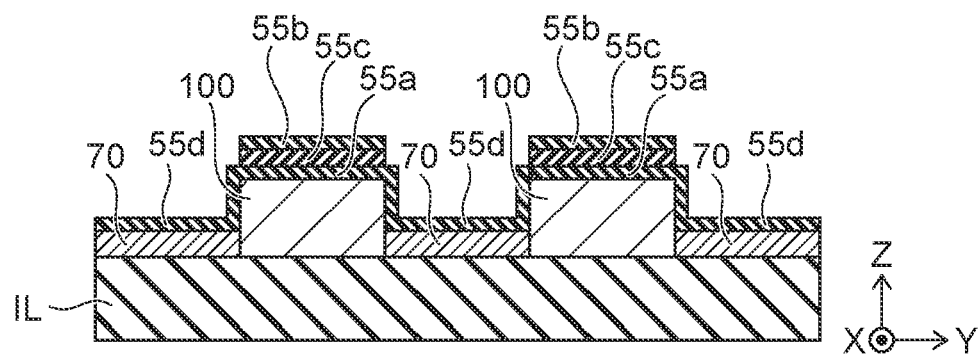

As shown in FIG. 16B, a second insulating film 55d that covers the inner surfaces of the separation trenches SG is formed, the second insulating film 55d is formed by, for example, thermal oxidation of the semiconductor layer 100 exposed at the inner surfaces of the separation trenches SG. Here, the semiconductor layer 100 includes the seventh semiconductor regions 70. The second insulating film 55d is, for example, a silicon oxide film.

Figure 16C:
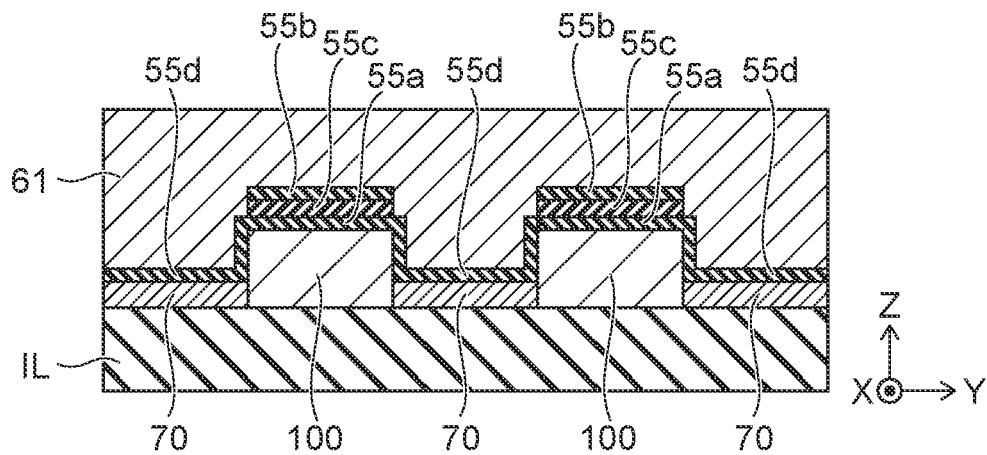

As shown in FIG. 16C, the conductive layer 61 is formed on the first and second insulating films 55 and 55d. The conductive layer 61 is, for example, a conductive polysilicon layer. The conductive layer 61 is formed, for example, using CVD to fill the separation trenches SG.

FIG. 17A is a schematic plan view showing the upper surface of the semiconductor layer 100.

As shown in FIG. 17A, the conductive layer 61 is patterned into the shape of the control electrode CG. The conductive layer 61 is selectively removed by, for example, dry etching.

Figure 17B:
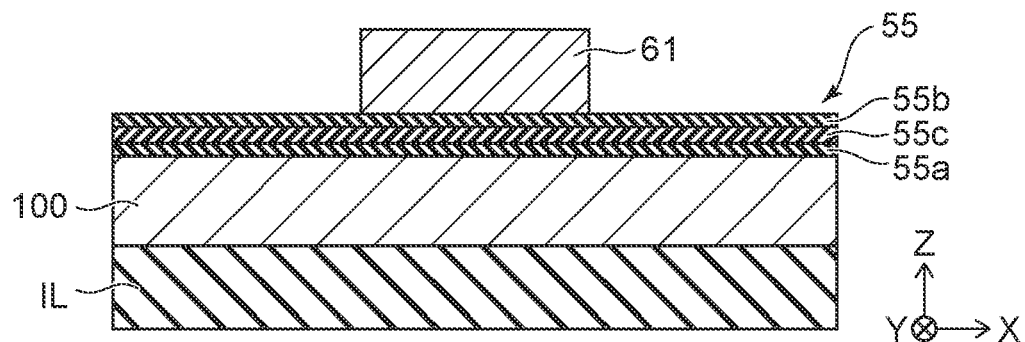

FIG. 17B is a cross-sectional view along M-M line shown in FIG. 17A. As shown in FIG. 17B, the second film 55b of the first insulating film 55 is partially removed in the process of selectively removing the conductive layer 61. That is, after removing the conductive layer 61 provided on the semiconductor parts, the second film 55b is removed when removing the portions of the conductive layer 61 formed inside the separation trenches. In the process of removing the conductive layer 61 inside the separation trenches, the third film 55c serves as an etching stop film when the third film 55c is exposed by removing the second film 55b. Moreover, the third film 55c also serves as an anti-etching film that prevents the semiconductor layer 100 from etching at the bottom of the separation trenches after removing the conductive layer 61 exposed.

Figure 17C:
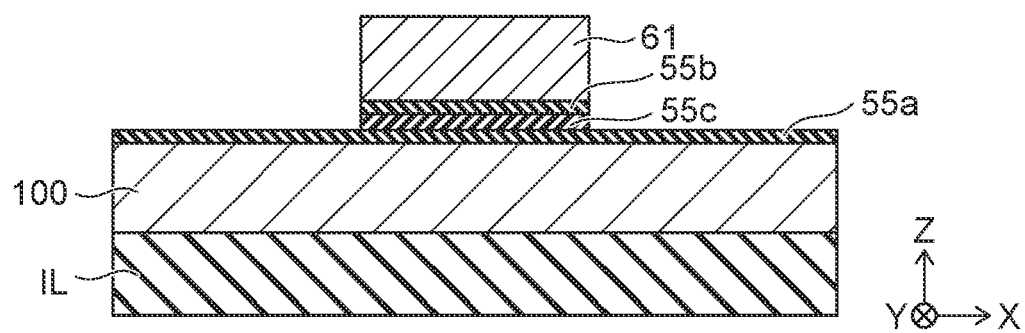

As shown in FIG. 17C, the third film 55c that is exposed after patterning the conductive layer 61 is selectively removed. The first film 55a is exposed thereby. Thus, it is possible in the patterning process of the conductive layer 61 to prevent the semiconductor layer 100 from etching by providing the third film 55c between the first film 55a and the second film 55b.

Figure 18A:
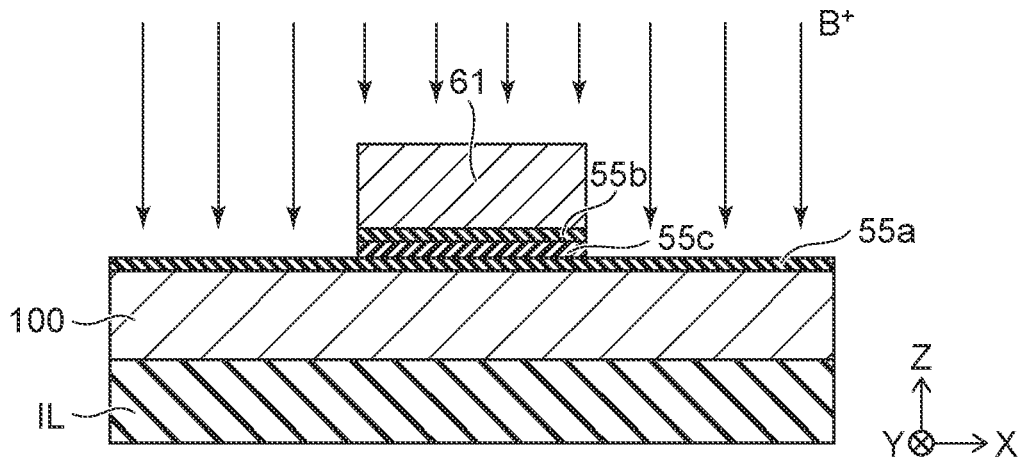

As shown in FIG. 18A, a second-conductivity-type impurity such as boron (B) or the like is selectively ion-implanted into the semiconductor layer 100. At this time, the second-conductivity-type impurity is ion-implanted into a part that is to be the second semiconductor part 2F. A first-conductivity-type impurity such as arsenic (As), phosphorus (P), or the like is ion-implanted into the other parts that are to be the first and third semiconductor parts 1F and 3F.

Figure 18B:
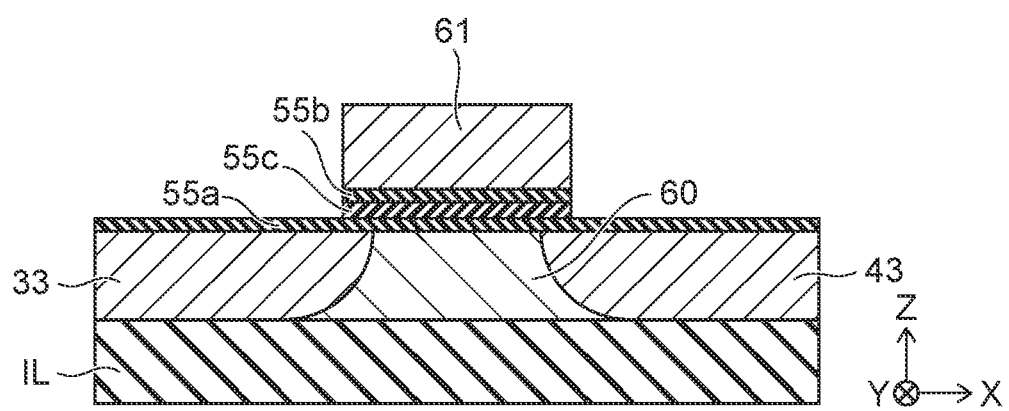

As shown in FIG. 18B, the body layers 33 and 43 are formed in the semiconductor layer 100. That is, the body layers 33 and 43 are formed by activating the ion-implanted second-conductivity-type impurity. The second-conductivity-type impurity is activated by heat treatment. Simultaneously, the SD layer 13 and the SD layer 23 are formed by activating the first-conductivity-type impurity ion-implanted into the other parts (see FIG. 14B).

Figure 18C:
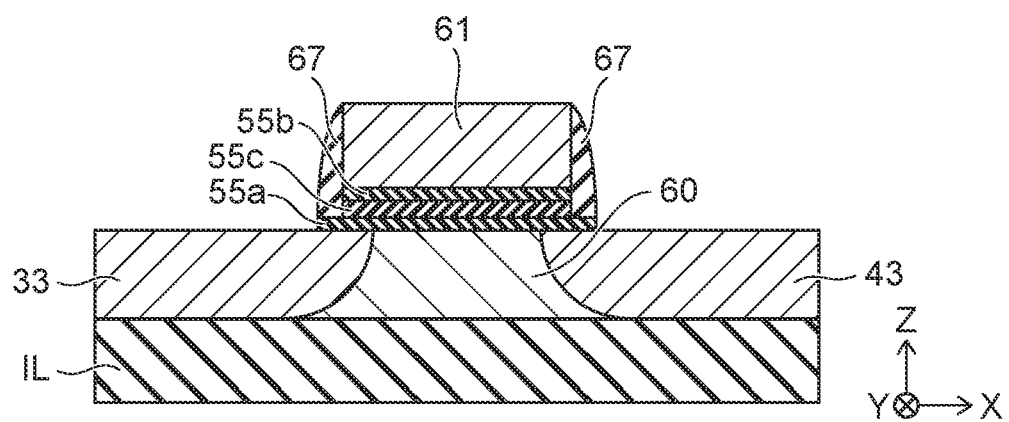

As shown in FIG. 18C, the sidewall 67 is formed on the side surface of the conductive layer 61. For example, the sidewall 67 is formed by performing anisotropic dry etching to selectively remove the silicon oxide film covering the conductive layer 61 and the semiconductor layer 100. The sidewalls 27 and 49 also are formed inside the separation trenches SG at this time (see FIG. 5B).

Continuing, the silicide layers 15, 25, 35, 45, and 63 are formed on the SD layers 13 and 23, the body layers 33 and 43, and the conductive layer 61 (see FIGS. 4B and 14B). The silicide layers are formed by, for example, forming a nickel (Ni) layer and like on the semiconductor layer 100 and the conductive layer 61 and then, by performing heat treatment.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   an insulating layer;
   a semiconductor layer provided on the insulating layer, the semiconductor layer including first and second semiconductor parts, the first and second parts each extending in a first direction along a front surface of the insulating layer, the first and second semiconductor parts being arranged in a second direction along the front surface of the insulating layer, the second direction crossing the first direction; and
   a control electrode provided on the semiconductor layer, the control electrode extending in the second direction over the first and second semiconductor parts, the control electrode being electrically insulated from the semiconductor layer by a first insulating film,
   the semiconductor layer including a first separation trench provided between the first semiconductor part and the second semiconductor part, the first separation trench extending in the first direction, the first separation trench being partially filled with a portion of the control electrode,
   the first semiconductor part including first and second semiconductor regions arranged in the first direction, the first and second semiconductor regions being of a first conductivity type,
   the second semiconductor part including third and fourth semiconductor regions arranged in the first direction, the third and fourth semiconductor regions being of a second conductivity type,
   the first semiconductor part further including a fifth semiconductor region provided between the first semiconductor region and the second semiconductor region, the fifth semiconductor region being of the second conductivity type,
   the second semiconductor part further including a sixth semiconductor region provided between the third semiconductor region and the fourth semiconductor region, the sixth semiconductor region being of the second conductivity type,
   the control electrode extending over the fifth semiconductor region of the first semiconductor part and the sixth semiconductor region of the second semiconductor part,
   the semiconductor layer further including a seventh semiconductor region of the second conductivity type, the seventh semiconductor region being provided at a bottom of the first separation trench and electrically connecting the fifth semiconductor region and the sixth semiconductor region.

2. The device according to claim 1, wherein the fifth to seventh semiconductor regions contact the insulating layer.

3. The device according to claim 1, wherein the first to seventh semiconductor regions contact the insulating layer.

4. The device according to claim 1, wherein the control electrode is provided on the seventh semiconductor region inside the first separation trench, and
the seventh semiconductor region is electrically insulated from the control electrode by the first insulating film.

5. The device according to claim 1, wherein
the sixth semiconductor region includes a second-conductivity-type impurity with a concentration lower than a concentration of a second-conductivity-type impurity in each of the third and fourth semiconductor regions, and
the seventh semiconductor region includes a second-conductivity-type impurity with a concentration higher than the concentration of the second-conductivity-type impurity in the sixth semiconductor region.

6. The device according to claim 1, wherein
the semiconductor layer further includes a third semiconductor part extending in the first direction, the third semiconductor part including an eight semiconductor region of the first conductivity type, a ninth semiconductor region of the first conductivity type, and a tenth semiconductor region of the second conductivity type between the eight semiconductor region and the ninth semiconductor region, the first to third semiconductor parts being arranged in the second direction, the second semiconductor part being provided between the first semiconductor part and the third semiconductor part,
the semiconductor layer further includes a second separation trench provided between the second semiconductor part and the third semiconductor part,
the semiconductor layer further includes an eleventh semiconductor region of the second conductivity type provided between the second semiconductor part and the third semiconductor part, the eleventh semiconductor region being provided at a bottom of the second separation trench, the eleventh semiconductor region electrically connecting the tenth semiconductor region and the sixth semiconductor region, and
the control electrode extends over the fifth semiconductor region of the first semiconductor part, the tenth semiconductor region of the third semiconductor part, and the sixth semiconductor region of the second semiconductor part, the second separation trench being partially filled with another portion of the control electrode.

7. The device according to claim 1, wherein
the first semiconductor region and the third semiconductor region are arranged in the second direction,
the second semiconductor region and the fourth semiconductor region are arranged in the second direction,
the fifth semiconductor region and the sixth semiconductor region are arranged in the second direction, and
the seventh semiconductor region is provided between the fifth semiconductor region and the sixth semiconductor region, not provided between the first semiconductor region and the third semiconductor region, and not provided between the second semiconductor region and the fourth semiconductor region.

8. The device according to claim 6, wherein
the seventh semiconductor region is provided at an entire bottom surface of at least one of the first separation trench or the second separation trench.

9. The device according to claim 6, wherein the semiconductor layer further includes fourth semiconductor part, the first to fourth semiconductor parts being arranged in the second direction, the fourth semiconductor part including a twelfth semiconductor region of the second conductivity type, a thirteenth semiconductor region of the second conductivity type, and a fourteenth semiconductor region of the second conductivity type between the twelfth semiconductor region and the thirteenth semiconductor region, the fourth semiconductor part being provided between the second semiconductor part and the third semiconductor part in the second direction,
the semiconductor layer further includes a third separation trench provided between the second semiconductor part and the fourth semiconductor part, and
the semiconductor layer further includes a fifteenth semiconductor region provided at a bottom of the third separation trench, the fifteenth semiconductor region electrically connecting the sixth semiconductor region of the second semiconductor part and the fourteenth semiconductor region of the fourth semiconductor part.

10. The device according to claim 1, wherein
the first insulating film includes a stacked structure of first to third films, the first film contacting the semiconductor layer, the second film contacting the control electrode, the third film being provided between the first film and the second film.

11. The device according to claim 10, wherein
the first film of the first insulating film is formed of a same material as a material of the second film of the first insulating film, and the third film of the first insulating film is formed of a different material from the material of the first film and the material of the second film.

12. The device according to claim 1, wherein
the semiconductor layer further includes a fifth semiconductor part, the first and second semiconductor parts and the fifth semiconductor part being arranged in the second direction, the fifth semiconductor part including a sixteen semiconductor region of the first conductivity type, a seventeenth semiconductor region of the first conductivity type, and an eighteenth semiconductor region of the second conductivity type between the sixteenth semiconductor region and the seventeenth semiconductor region, the first semiconductor part being provided between the fifth semiconductor part and the second semiconductor part,
the semiconductor layer further includes a fourth separation trench provided between the first semiconductor part and the fifth semiconductor part, and
the semiconductor layer further includes a nineteenth semiconductor region of the second conductivity type, the nineteenth semiconductor region being provided at a bottom of the fourth separation trench, the nineteenth semiconductor region electrically connecting the fifth semiconductor region of the first semiconductor part and the eighteenth semiconductor region of the fifth semiconductor part.

13. The device according to claim 12, wherein
the semiconductor layer further includes a pair of twentieth semiconductor regions of the first conductivity type, the twentieth semiconductor regions being provided at the bottom of the fourth separation trench;
one of the twentieth semiconductor regions is provided between the first semiconductor region of the first semiconductor part and the sixteenth semiconductor region of the fifth semiconductor part; and
the other of the twentieth semiconductor regions is provided between the second semiconductor region of the first semiconductor part and the seventeenth semiconductor region of the fifth semiconductor part.

14. The device according to claim 13, wherein the nineteenth semiconductor region is provided between the insulating layer and the control electrode, the nineteenth semiconductor region being electrically insulated from the control electrode by the first insulating film, and the nineteenth semiconductor region is provided between the pair of twentieth semiconductor regions, the nineteenth semiconductor region and the pair of twentieth semiconductor regions contacting the insulating film.

* * * * *